(12) United States Patent
Yamazaki

(10) Patent No.: US 8,624,358 B2
(45) Date of Patent: Jan. 7, 2014

(54) SEMICONDUCTOR SUBSTRATE AND SEMICONDUCTOR DEVICE

(75) Inventor: Mitsuharu Yamazaki, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 52 days.

(21) Appl. No.: 13/375,012

(22) PCT Filed: Jun. 3, 2010

(86) PCT No.: PCT/JP2010/059473
§ 371 (c)(1),
(2), (4) Date: Nov. 29, 2011

(87) PCT Pub. No.: WO2010/140666
PCT Pub. Date: Dec. 9, 2010

(65) Prior Publication Data
US 2012/0068311 A1 Mar. 22, 2012

(30) Foreign Application Priority Data
Jun. 4, 2009 (JP) ................................. 2009-134617

(51) Int. Cl.
*H01L 29/06* (2006.01)
(52) U.S. Cl.
USPC ..... 257/619; 257/622; 257/730; 257/E33.058
(58) Field of Classification Search
USPC .................... 257/98–100, 431–433
See application file for complete search history.

(56) References Cited

U.S. PATENT DOCUMENTS

| 6,707,150 B1* | 3/2004 | Lee ............................... 257/730 |
| 7,559,671 B2* | 7/2009 | Lee et al. ........................ 362/234 |
| 2006/0027826 A1* | 2/2006 | Goodrich .......................... 257/99 |
| 2007/0097683 A1* | 5/2007 | Chikugawa ..................... 362/241 |
| 2008/0290357 A1* | 11/2008 | Lin et al. .......................... 257/98 |
| 2009/0026485 A1* | 1/2009 | Urano et al. ....................... 257/99 |
| 2009/0230417 A1* | 9/2009 | Tsai et al. ........................ 257/98 |

FOREIGN PATENT DOCUMENTS

| JP | 2002-100589 | 4/2002 |
| JP | 2004-281551 | 10/2004 |
| JP | 2008-218820 | 9/2008 |
| WO | WO 04/001819 | 12/2003 |

OTHER PUBLICATIONS

International Search Report mailed on Jul. 13, 2010.

* cited by examiner

*Primary Examiner* — Dung A. Le
(74) *Attorney, Agent, or Firm* — IPUSA, LLC

(57) ABSTRACT

A semiconductor substrate having a semiconductor device formable area, wherein a reinforcing part, which is thicker than the semiconductor device formable area and has a top part of which surface is flat, is formed on an outer circumference part of the semiconductor substrate, and an inner side surface connecting the top part of the reinforcing part and the semiconductor device formable area has a cross-sectional shape of which inner diameter becomes smaller as being closer to the semiconductor device formable area.

10 Claims, 18 Drawing Sheets

- 50
- 40 REINFORCING RING
- 41
- 42
- Φ150~300
- 300 μm OR LESS
- 11
- 12
- ABOUT 600 μm
- 10
- 60

- 60
- 40
- 41
- 42
- 11

SEMICONDUCTOR SUBSTRATE AND SEMICONDUCTOR DEVICE

This application is the national stage of International Application No. PCT/JP2010/059473 filed on Jun. 3, 2010 and claims the benefit of priority to Japanese Patent Application No. 2009-134617 filed on Jun. 4, 2009, the entire contents of which are herein incorporated by reference.

TECHNICAL FIELD

The present invention relates to a semiconductor substrate and a manufacturing method thereof and a semiconductor device and a manufacturing method thereof.

BACKGROUND ART

Conventionally, there is a demand for making a semiconductor substrate, which is used for forming a semiconductor device such as a power metal oxide semiconductor (MOS), thinner to reduce a manufacturing cost, and, thus, a thin-type semiconductor substrate has been manufactured.

However, a thinned semiconductor substrate of 300 (μm) or less is close to a paper or a film, and it is difficult to be subjected to handling such as a conveyance in a semiconductor manufacturing process. Thus, in order to eliminate such a problem, there is known a wafer of which an inner area of a boundary line, which is at a position offset inwardly from the outer edge of the wafer, is thinned and a material having a rigidity higher than the wafer covers an inner wall of a thick part exiting on outer side of the boundary line to increase a strength (for example, refer to Patent Document 1). Additionally, as a manufacturing method of the wafer disclosed in the Patent Document 1, there is disclosed a manufacturing method including a trench forming process of forming a trench extending along the boundary line from a front surface of the wafer to a back surface by applying an anisotropic etching to a range along the boundary line, and a removing process of removing a semiconductor exiting inside the trench until the surface of the wafer existing inside the trench reaches a bottom surface of the trench.

In the wafer disclosed in the Patent Document 1 and the manufacturing method thereof, the inner wall of the trench is formed in flat and smooth by continuing the etching to maintain the aspect ratio of the trench to 7 to 9 when forming the trench, and the trench of which a connecting part between the inner wall and the bottom surface is rounded is formed. Thereby, the wafer can be made so that the inner wall of the thick part is flat and smooth and a stress is hardly concentrated into a connecting part between the thick part and a thin part, and it is hardly destroyed and easy to handle.

Patent Document 1: Japanese Laid-Open Patent Application No. 2008-218820

DISCLOSURE OF THE INVENTION

Problems to be Solved by the Invention

However, in the wafer disclosed in the above-mentioned Patent Document 1 and the manufacturing method thereof, because the inner wall of the thick part is formed to be substantially perpendicular to the bottom surface part, a supplied resist liquid is stored on the bottom surface part of the wafer in a film forming process such as a resist forming process in an actual semiconductor device manufacturing process, there is a problem in that a desired film thickness cannot be acquired.

That is, in a normal semiconductor device manufacturing process, when forming a pattern, a resist liquid is supplied onto the semiconductor substrate and the resist liquid is supplied to the entire surface of the semiconductor substrate by rotating the semiconductor substrate, and an excessive liquid is spun off by rotation to form a resist film of a desired film thickness. At this time, in the wafer disclosed in the Patent Document 1, the resist liquid is not spun off from the wafer due to the thick part existing on the outer circumferential edge as a perpendicular wall, and the resist liquid remains on the wafer. Besides, other than the resist, there is the problem that a desired film thickness cannot be acquired in a process of forming a film on the wafer surface by supplying a processing liquid in a semiconductor manufacturing process.

Thus, it is an object of the present invention to provide a semiconductor substrate and a manufacturing method thereof and a semiconductor device and a manufacturing method thereof, which can maintain a strength of a thin-type semiconductor substrate while a desired film thickness can be acquired in a film forming process of a semiconductor device manufacturing process.

Means to Solve the Problem

In order to achieve the above mentioned object, a semiconductor substrate according to an aspect of the present invention is a semiconductor substrate having a semiconductor device formable area, wherein a reinforcing part, which is thicker than said semiconductor device formable area and has a top part of which surface is flat, is formed on an outer circumference part of the semiconductor substrate, and an inner side surface connecting said top part of the reinforcing part and said semiconductor device formable area has a cross-sectional shape of which inner diameter becomes smaller in proportion to its closeness to said semiconductor device formable area.

Accordingly, the semiconductor substrate can be reinforced by the reinforcing part of the outer circumference part, and a process liquid supplied to the semiconductor device formable area can be spun off by rotation because the side surface of the reinforcing part has an inclined surface, which expands as it approaches the top part.

In said semiconductor device, said inner side surface may have a cross-sectional shape lineally connecting said top part and said semiconductor device formable area.

Accordingly, the semiconductor substrate is made, in which the side surface of the reinforcing part can be formed by machining. With simple processing, a film formation process such as a resist forming process can be performed appropriately while a sufficient strength is maintained in conveyance, and thermal diffusion of the semiconductor manufacturing process.

In said semiconductor substrate, said inner side surface may have a cross-sectional shape of which inclination angle becomes smaller in proportion to its closeness to said semiconductor device formable area.

Accordingly, the inner side surface of the reinforcing part can be formed by an etching process, and a side surface shape can be made which can easily spin off a process liquid supplied to the semiconductor device formable area in the semiconductor manufacturing process of forming a semiconductor device in the semiconductor substrate.

In said semiconductor substrate, said reinforcing part may be formed by a semiconductor and has a cross-sectional structure of a sandwich structure having an oxidation film in a portion of the same thickness as said semiconductor device formable area.

Accordingly, the reinforcing part, which is a separate member, can be joined onto a thin-type semiconductor substrate using the oxidation film, and the reinforcing part having a different thickness can be easily formed in the semiconductor substrate.

In said semiconductor substrate, said semiconductor device formable area and said reinforcing part may be integrally formed by a semiconductor.

Accordingly, the semiconductor substrate having a thin-type semiconductor device formable area can be formed from a single sheet of thick semiconductor substrate, and a thin-type semiconductor substrate can be provided while using an original thickness in the reinforcing part.

In said semiconductor substrate, said semiconductor device formable area may have a thickness equal to or smaller than 300 μm, and said reinforcing part may have a thickness equal to or larger than 500 μm.

Accordingly, a strength necessary for conveyance and diffusion heat treatment can be given to the semiconductor substrate in a state close to a paper or a film, which results in a semiconductor device that can be manufactured at a low cost by using a thin-type semiconductor substrate, and a semiconductor manufacturing process can be performed appropriately in a usual manner.

A manufacturing method of a semiconductor substrate according to another aspect of the present invention is a manufacturing method of a semiconductor substrate including a semiconductor device formable area and a reinforcing part in an outer circumference part surrounding the semiconductor device formable area, the reinforcing part being thicker than the semiconductor device formable area, comprising:

a step of preparing a semiconductor substrate to be reinforced including said semiconductor device formable area, an oxidation film being formed on a surface of the semiconductor substrate to be reinforced;

a positioning step of overlapping a reinforcing ring on a surface of said semiconductor substrate to be reinforced so that an outer circumference shape of the reinforcing ring is coincident with the surface of said semiconductor substrate to be reinforced, the reinforcing ring having the outer circumference shape coincident with the semiconductor substrate to be reinforced, an opening being formed at a position covering said semiconductor device formable area, an oxidation film being formed on a bottom surface; and a laminating step of joining said oxidation films to each other by performing heat treatment.

Accordingly, a thin-type semiconductor substrate, which is reinforced and can be handled easily, can be manufactured easily with a simple process by using covalent bonding according to a heat treatment of the oxidation films.

In said manufacturing method of a semiconductor substrate, said reinforcing ring may have a top part of which top surface is flat, and mat have a cross-sectional shape having an inner side surface of a side of said opening connecting the top part and said bottom surface becomes smaller as being closer to said bottom surface.

Accordingly, in the film forming process of the semiconductor manufacturing process, a semiconductor substrate, which can easily perform spin-off of a process liquid, can be manufactured.

A semiconductor device according to another aspect of the present invention is a semiconductor device formed in a semiconductor device formable area of a semiconductor substrate, wherein a reinforcing part, which is thicker than said semiconductor device formable area and has a top part of which surface is flat, is formed on an outer circumference part of one surface of said semiconductor substrate, and diffusion layers are formed on both surfaces of said semiconductor device formable area.

In said semiconductor device, an electrode may be formed on a surface of said semiconductor substrate on which surface said reinforcing part is not formed.

In said semiconductor device, said diffusion layer of the surface on which said reinforcing part of said semiconductor substrate is formed is a source or an emitter, and said diffusion layer of a surface on which said reinforcing part is not formed is a drain or a collector.

In said semiconductor device, an inner side surface connecting said top part of said reinforcing part and said semiconductor device formable area may have a cross-sectional shape of which an inner diameter becomes smaller in proportion to its closeness to said semiconductor device formable area.

A manufacturing method of a semiconductor device according to another aspect of the present invention is a manufacturing method of a semiconductor device using said semiconductor substrate, which comprises an application step of rotating said semiconductor substrate while supplying a process liquid for forming a film to a semiconductor device formable area of said semiconductor substrate to spread said process liquid to all over said semiconductor device formable area, and adjusting a remaining amount of said process liquid of said semiconductor device formable area so that a thickness of the film is set to a predetermined thickness.

Accordingly, a film of a desired thickness can be formed in the manufacturing process of the semiconductor device, and an appropriate accuracy can be maintained in the manufacturing process while reducing the manufacturing cost of the semiconductor device.

In said manufacturing method of a semiconductor apparatus, said process liquid may be a resist liquid.

Accordingly, in a resist film forming process which is necessary when manufacturing a semiconductor device such as a power MOS transistor, a film thickness of a resist film can be controlled appropriately, and both a reduction in the manufacturing const and maintenance of accuracy in the manufacturing process can be satisfied.

A manufacturing method of a semiconductor device according to another aspect of the present invention comprises:

a first diffusion layer forming step of forming a first diffusion layer by implanting ions into a first surface of a semiconductor substrate;

a concave shape forming step of forming a concave shape on a second surface of said semiconductor substrate, a central part of said semiconductor substrate in the concave shape having a thickness smaller than an outer circumference part; and a concave part processing step of forming a second diffusion layer and a gate on a surface of a concave part, which is a recessed portion of said concave shape.

In said manufacturing method of a semiconductor device, said concave part processing step may perform processing in a state where said first surface of said semiconductor substrate is brought into contact with a stage.

Said manufacturing method of a semiconductor device may further comprise a damage layer removing step of removing a damage layer generated on the surface of said concave part in said concave shape forming step between said concave shape forming step and said concave part processing step.

In said manufacturing method of a semiconductor device, said first diffusion layer forming step may be performed before said concave part processing step.

In said manufacturing method of a semiconductor device, said first diffusion layer may be a drain or a collector, and said second diffusion layer may be a source or an emitter.

In said manufacturing method of a semiconductor device, in said concave shape forming step, said concave part may be formed so that an inner diameter of said outer circumference part becomes smaller as being closer to the surface of said concave part.

Effect of the Invention

According to the present invention, while maintaining a substrate strength, a semiconductor substrate, which enables an appropriate film forming process of a semiconductor manufacturing process thereafter, can be provided.

Figure 1A:
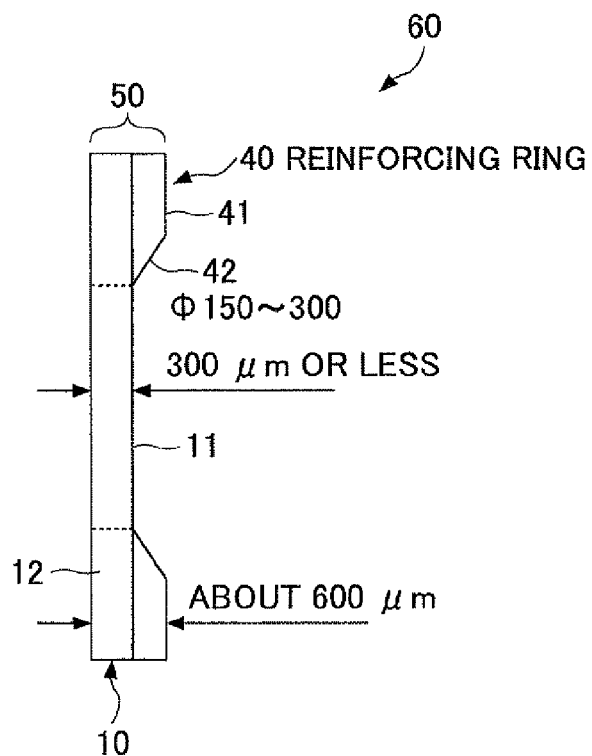
FIG. 1A is a view illustrating an example of a cross-sectional structure of a semiconductor substrate according to an embodiment 1 of the present invention.

EXPLANATION OF REFERENCE SIGNS 10 semiconductor substrate to be reinforced
11, 11a-11e semiconductor device formable area
12 outer circumference part
13 outer circumference edge part
15 semiconductor substrate
16 first surface (back surface)
17 second surface (front surface)
18 concave part
20 power MOS transistor
21 drain
21a drain electrode
22 low-concentration N layer
23 N layer
24 channel
25 source
26 source contact
26a source electrode
27 gate
27a gate electrode
28, 30, 31, 32 oxidation film
40, 40a reinforcing ring
41, 51 top part
42, 42a, 52, 52a inner side-surface
43 outer side-surface
44 bottom surface
45, 45a, 55, 55a opening
50, 50a, 50b, 50c, 50d reinforcing part
60, 60a-60h semiconductor substrate
70, 71 processing liquid supply means
80-86 stage
87 attachment 90 process furnace
100 heater
130 substrate retaining tool
131 retaining groove
140 heat-insulating plate
150 placement stage
160 lid member
170 vertical-type heat treatment apparatus
180, 190, 200, 210 semiconductor device
181, 191 drain area
182, 192, 202, 212 high-concentration diffusion area
182a, 192a drain electrode
182b, 192b drain electrode
183, 193, 204, 214 low-concentration N layer
184, 194, 205, 215 channel
185, 195 source area
185a, 195a source metal
185b, 195b source electrode
187, 197, 201, 217 gate
187a, 197a, 201a, 217a gate electrode
188, 198, 201, 218 oxidation film
201, 211 collector area
202a, 212a collector metal
202b, 212b collector electrode
203, 213 high-concentration N layer
206, 216 emitter area
206a, 216a emitter metal
206b, 216b emitter electrode
220 resist

BEST MODE FOR CARRYING OUT THE INVENTION

A description will be given below, with reference to the drawings, of bet mode for carrying out the present invention.

Embodiment 1

Figure 1B:
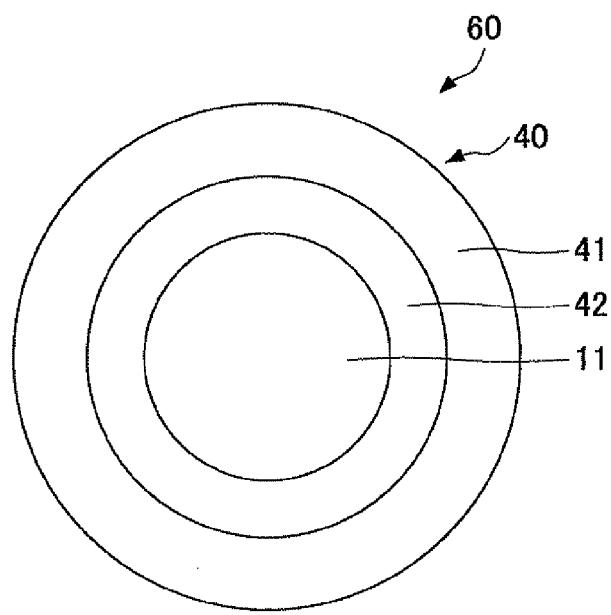
FIG. 1B is a top view illustrating a plan structure of the semiconductor substrate according to the embodiment 1.

FIG. 1A and FIG. 1B are views illustrating an example of an outline structure of a semiconductor substrate 60 according to an embodiment 1 of the present invention. FIG. 1A is a view illustrating an example of a cross-sectional structure of the semiconductor substrate according to the embodiment 1 of the present invention, and FIG. 1B is a top view illustrating a plan structure of the semiconductor substrate according to the embodiment 1.

In FIG. 1A, the semiconductor substrate 60 according to the embodiment 1 comprises a semiconductor substrate 1 to be reinforced and a reinforcing ring 40. The semiconductor substrate 1 to be reinforced has a semiconductor device formable area 11 and an outer circumference part 12. The outer circumference part 12 and the reinforcing part 40 of the semiconductor substrate 1 to be reinforced constitute a reinforcing part 50.

The semiconductor substrate 1 to be reinforced includes the semiconductor device formable area 11 in the center part where a semiconductor device such as a semiconductor chip is formed and the outer circumference part 12 where the reinforcing ring 40 is provided. The semiconductor substrate 1 to be reinforced may be constituted by various kinds of semiconductor materials, and, for example, a substrate material such as silicon, SiC, etc., may be used.

The semiconductor device formable area 11 is an area where a semiconductor apparatus including a semiconductor device, such as a power MOS transistor, is formable. In recent years, there are many cases where a semiconductor device is required to be of a thin-type in view of reducing a manufacturing const and reducing an ON resistance. For example, the semiconductor device deformable area 11 for forming a semiconductor chip is required to be equal to or smaller than 300 μm in many cases. On the other hand, also in view of reducing manufacturing cost, the semiconductor substrate 60 is required to have a large surface area so that a large number of semiconductor devices can be formed from one sheet of semiconductor substrate 60. For example, the semiconductor substrate 10 to be reinforced may have a size of 150 mm to 300 mm in many cases to form semiconductor devices.

The outer circumference part 12 is an outside portion containing an outer edge of the semiconductor substrate 10 to be reinforced. The outer circumference part 12 may be of the same material as the semiconductor device formable area 11 and integrally formed as a single sheet of semiconductor substrate. Because the outer circumference part 12 is provided with the reinforcing ring 40, it is in a state where a semiconductor device cannot be formed. In the semiconductor substrate 60 according to the present embodiment, a handling operation such as conveyance, etc., is made easy on the entire semiconductor substrate 60 by providing the reinforcing ring 40 to the outer circumference part 12 of the semiconductor substrate 10 to be reinforced.

The reinforcing ring 40 is a member for reinforcing the semiconductor substrate 10 to be reinforced, and may be formed of the same semiconductor material as the semiconductor substrate 10 to be reinforced. The reinforcing ring 40 increases the thickness of the outer circumference part 12 of the semiconductor substrate 10 to be reinforced by being coupled with the semiconductor substrate 10 to be reinforces to achieve easy handling such as conveyance of the semiconductor substrate 60 as a whole.

The reinforcement ring 40 has a part 41 with a surface which is flat. Thereby, in a case where whichever surface of the semiconductor substrate 60 is on the bottom side, the semiconductor substrate 60 can be dealt with by contacting the flat surface, thereby performing handling such as conveyance of the semiconductor substrate 60 in a stable state. Additionally, the top surface 41 of the reinforcing ring 40 may be configured to have a width equal to or smaller than 10 mm. For example, if it is a semiconductor substrate 10 to be processed has a diameter equal to or smaller than 200 mm, and if it has a width equal to or smaller than 10 mm, it will have sufficient strength, and conveyance of the semiconductor substrate 60 can be performed as usual.

The inner side surface 42 of the reinforcing ring 40 has a cross-sectional shape of which inner circumference decreases as being closer to the semiconductor device formable area 11 of the semiconductor substrate 10 to be reinforced. That is, it is configured that the opening is smaller as it becomes closer to the bottom surface, and the opening is larger as it becomes closer to the top part. By making such a structure, when a processing liquid such as a resist liquid is supplied onto the semiconductor device formable area 11 of the semiconductor substrate 60, the processing liquid can move easily on an inclined surface of the inner side surface by rotating the semiconductor substrate 60, which enables spinning off the processing liquid.

The reinforcing ring 40 integrally constitutes the reinforcing part 50 together with outer circumference part 12 of the semiconductor substrate 10 to be reinforced. The reinforcing part is configured to have, for example, a thickness equal to or larger than 500 μm in its entirety, and preferably be configured to have a thickness of about 600 μm. Although the reinforcing part 50 has a structure in which the semiconductor substrate 10 to be reinforced and the reinforcing ring 40 are laminated with each other when viewing the cross-sectional structure as illustrated in FIG. 1A, it has a structure in which the semiconductor device formable area 11 is configured to be thin and the reinforcing part 50 is formed in the outer circumference part 12 to surround the semiconductor device formable area 11. By having such a structure, the semiconductor substrate 10 to be reinforced and the reinforcing ring 40 are not always be separate members, and may be integrally formed by a single sheet of semiconductor substrate, or may be formed by a combination of pieces of other shapes. This point will be explained later.

Although FIG. 1B illustrates the top view of the semiconductor substrate according to the embodiment 1, the reinforcing ring 40, which has the inner side surface 42 and the top part 41, constitutes the reinforcing part 50 to surround the outer circumference part 12 of the semiconductor device formable area 11. Moreover, as to the outer edge of the semiconductor substrate 60, it is configured so that the reinforcing ring 40 is coincident with the outer edge of the semiconductor substrate 10 to be reinforced. In addition, although the case where the semiconductor substrate 60 is a circular shape and the reinforcing ring 40 is an annular shape is explained in the present embodiment, when, for example, an orientation flat or a notch is formed in the semiconductor substrate 10 to be reinforced, the reinforcing ring 40 may be formed to be arranged along the orientation flat or may be formed in a part excluding the orientation flat or the notch. That is, the reinforcing ring 40 can be of any shape if it is provided in the outer circumference part of the semiconductor substrate 10 to be reinforced, and can reinforce the semiconductor substrate 10 to be reinforced.

Moreover, in FIG. 1B, for the sake of easy understanding, the area of the reinforcing ring 40 is illustrated larger to match FIG. 1A, but in the actual semiconductor substrate 60, it can be configured at a ratio at which the reinforcing ring 40 equal to or smaller than 10 mm is provided in the above-mentioned semiconductor substrate 60 of a diameter of 200 mm.

Figure 2:
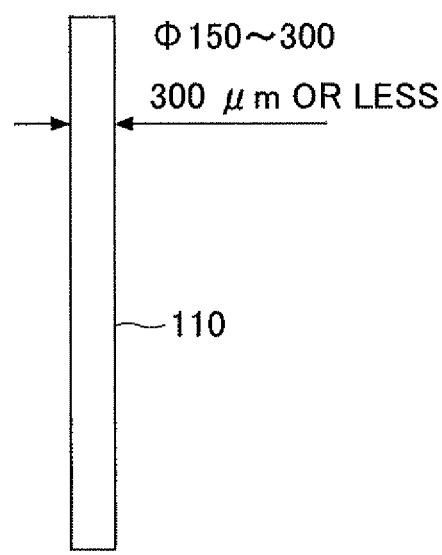
FIG. 2 is a view illustrating a cross-sectional structure of a conventional thin-type semiconductor substrate as a reference example.

FIG. 2 is a view illustrating a cross-sectional structure of a conventional semiconductor substrate 110 of a thin-type as a reference example for comparison. In FIG. 2, if, for example, it is configured to be a thickness equal to or smaller than 300 μm and has a diameter of 150 to 300 mm, it becomes in a paper-thin state, and it is not only difficult to grasp side surfaces but also in a state in which the semiconductor substrate is bowed when it is placed on a conveyance table smaller than the diameter of the semiconductor substrate 110, which may generate a slippage (displacement) of semiconductor elements. On the other hand, in view of forming a semiconductor device, in a case of a semiconductor device having a structure in which electrodes are formed on a back surface such as a power MOS transistor, there is a large demand for the thin-type semiconductor substrate 110 because there is an advantage in a manufacturing cost if the semiconductor substrate 110 is thin.

Figure 3:
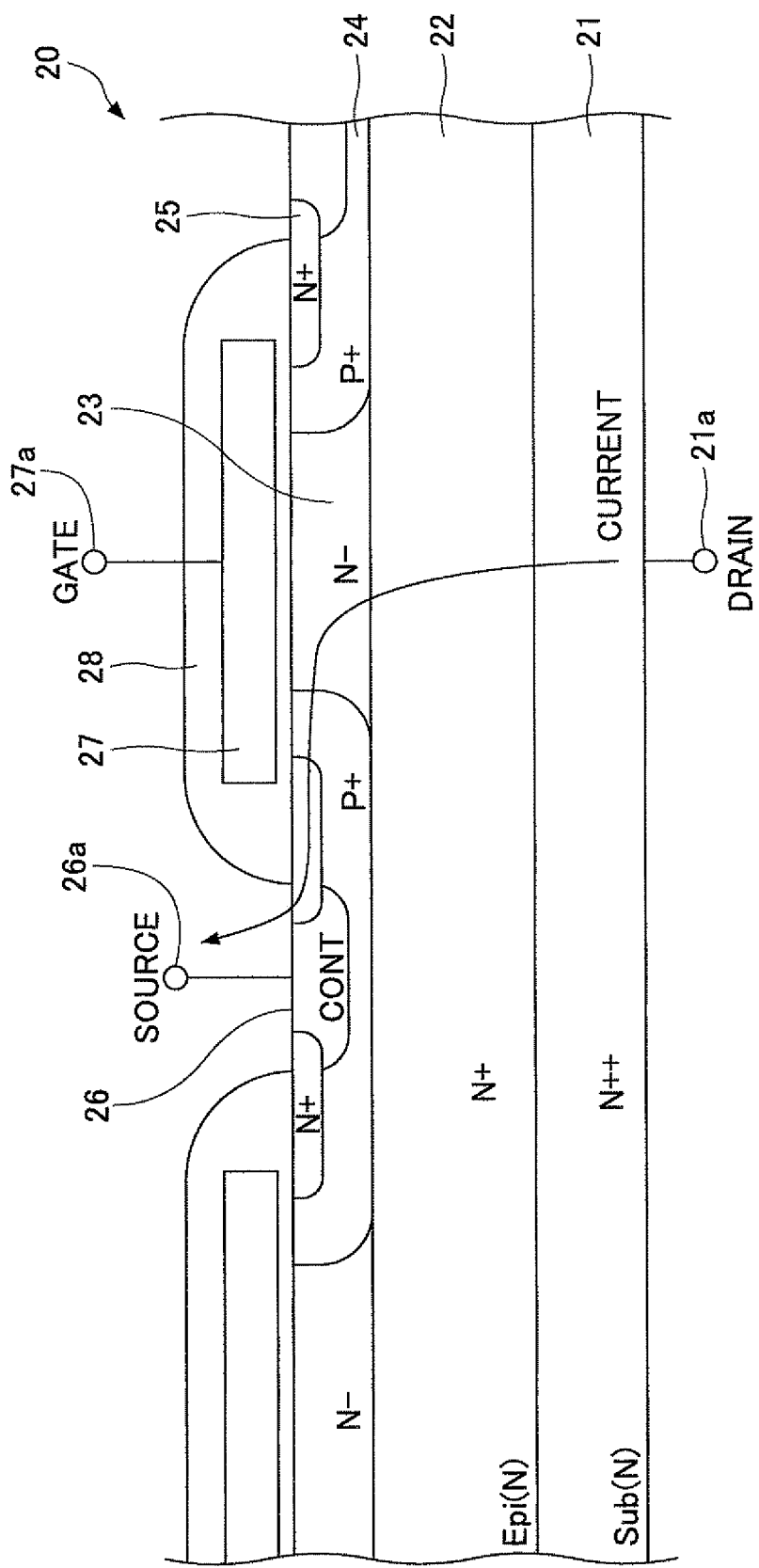
FIG. 3 is a view illustrating an example of a power MOS transistor.

FIG. 3 is a view illustrating an example in which a power MOS transistor 20 is formed in the semiconductor device formable area 11 of the semiconductor substrate 60 according to the embodiment 1. In FIG. 3, the power MOS transistor 20 includes a drain area 21, which is a high-concentration N layer formed of a silicon substrate, an N layer 22, which is epitaxially grown, a surface N layer 23, a channel 24 of a P layer, a source area 25 of an N layer, a source contact 26, a gate 27, an oxidation film 28, a drain electrode 21a, a source electrode 26a and a gate electrode 27a. When a positive voltage is applied from the gate electrode 27a to the source area 25, the channel 24 is open and a current flows from the drain area 21 to the source area 25 and the power MOS transistor 20 is driven. In the power MOS transistor 20 of such a vertical type, the drain area 21 and the drain electrode 21a are formed on the back surface of the semiconductor substrate 60, and is necessary to form a diffusion layer over an entire cross section between the front surface and the back surface. Thus, because each semiconductor layer can be set thinner as the thickness of the semiconductor substrate is thinner, an amount of heat can be reduced in the heat treatment to form each semiconductor layer and a manufacture of the semiconductor device can be performed at a low-cost. Therefore, it is desirable to make the semiconductor device formable area 11 thin in respect of the manufacture of the semiconductor devices. However, if it is made thin, a difficulty in handling, such as during conveyance, may happen. Thus, such a difficulty in handling is eliminated while still responding to a demand for a thin-type, by configuring the semiconductor device formable area 11 for forming the semiconductor devices to be of a thin-type, and also configuring the circumference with the reinforcing part 50.

Figure 4:
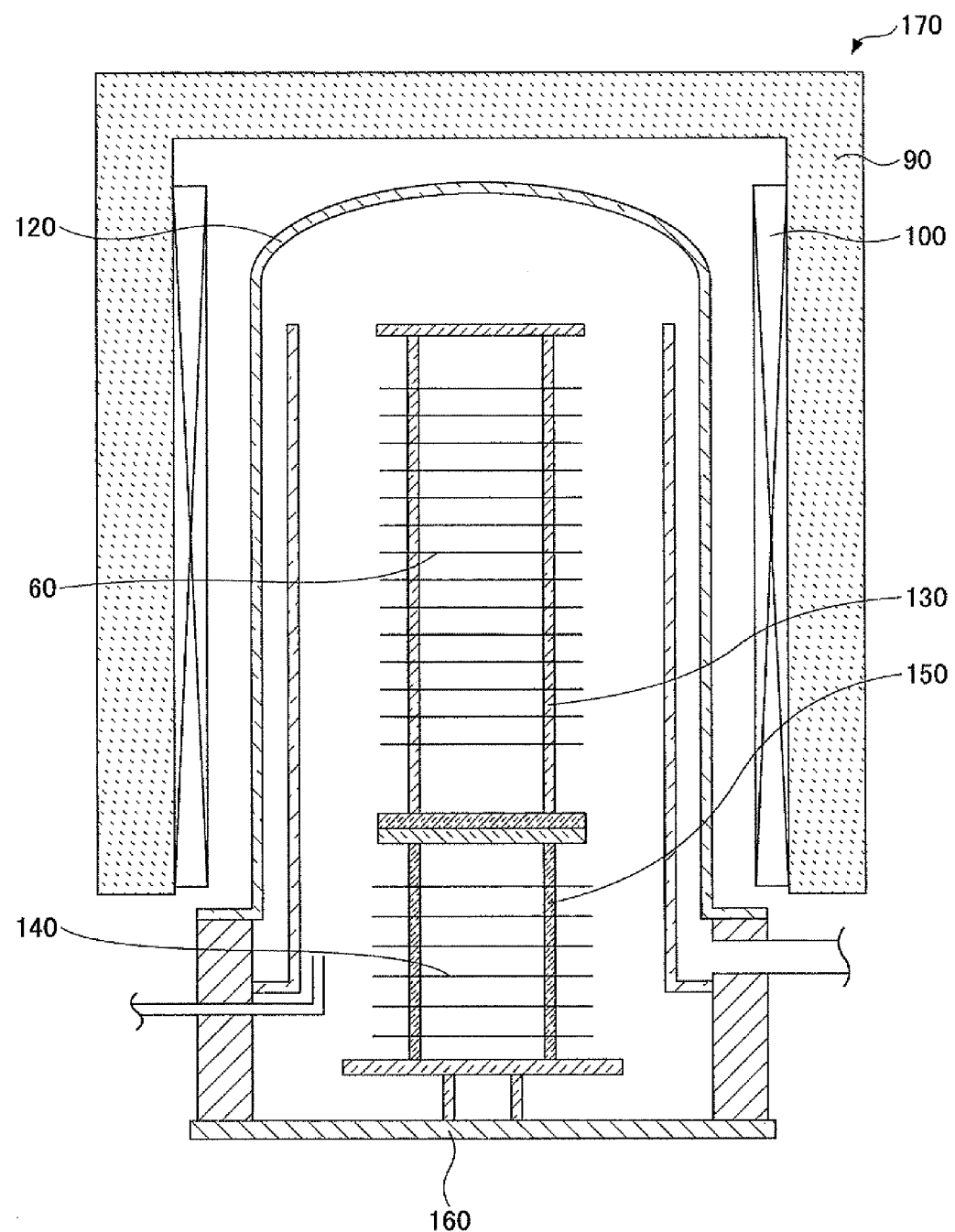
FIG. 4 is a view illustrating an example of a cross-sectional structure of a vertical-type heat treatment apparatus.

FIG. 4 is a view illustrating an example of a cross-sectional structure of a vertical-type heat treatment apparatus 170 used for a semiconductor manufacturing process. In FIG. 4, the vertical-type heat treatment apparatus 170 is provided with a double reaction tube 120 in a process furnace 90 equipped with a heater 100. A substrate retaining tool 130, which accommodates the semiconductor substrates 60 in multiple stages, is located in the reaction tube 120. The substrate retaining tool 130 is provided on a lid body 160, and provided on a placement table 150 having a plurality of insulating plates 140 arranged in parallel. The semiconductor substrates 60 are heated while being supported in the above-mentioned state and a process of heat diffusion is performed.

Figure 5:
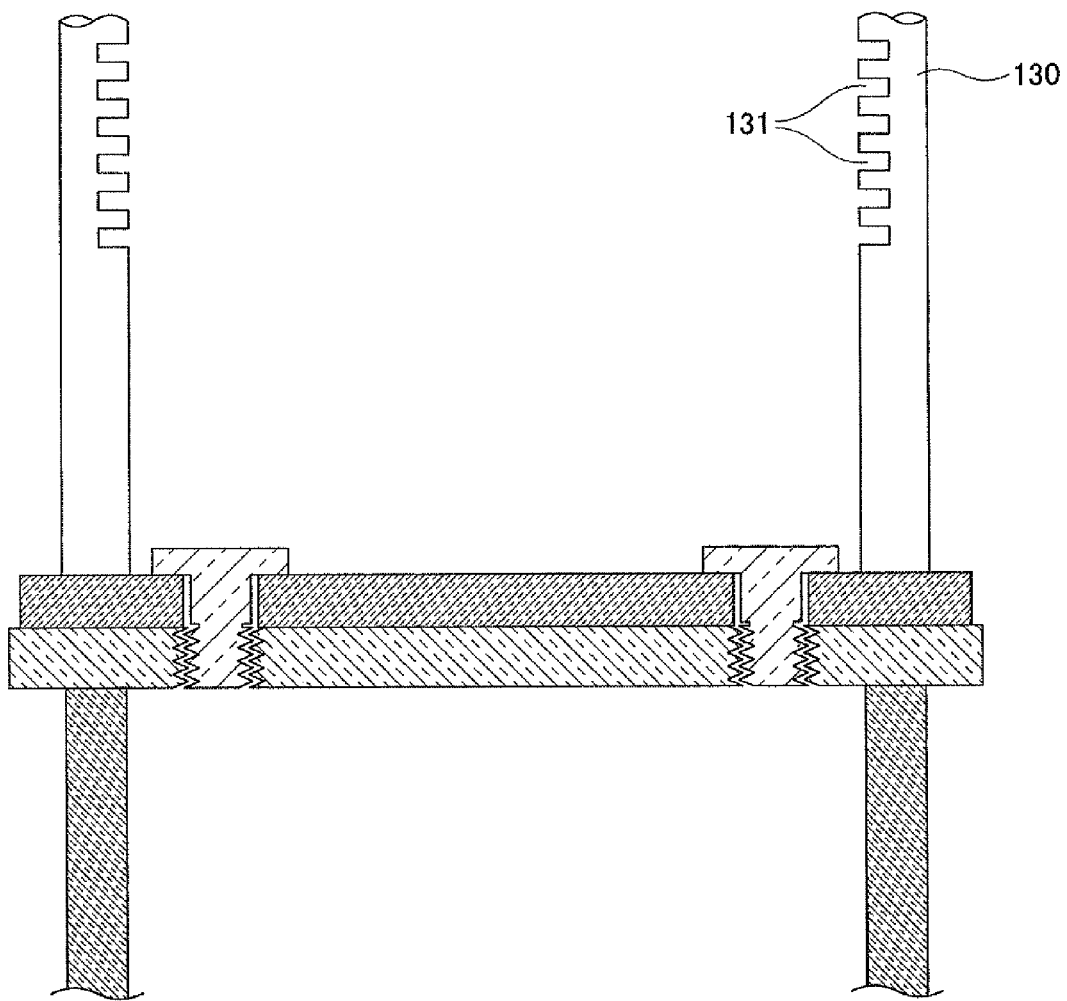
FIG. 5 is an enlarged view of a substrate retaining too of the vertical-type heat treatment apparatus.

FIG. 5 is an enlarged view of the substrate retaining tool 130 of the vertical-type heat treatment apparatus 170. Retaining grooves 130 for supporting the semiconductor substrates 60 are formed in the substrate retaining tool 130. The semiconductor substrates 60 are supported by being sandwiched by the retaining grooves 131, and the semiconductor substrates are retained in the reaction tube 120 and being heat-treated. Here, if the semiconductor substrate 60 has a structure of a thin state similar to a paper or a film such as illustrated in FIG. 2, that is, a structure of the conventional thin-type semiconductor substrate 110, the middle part of the semiconductor substrate 110 is recessed and bent downward even if the semiconductor substrate 110 is sandwiched between the retaining grooves 131, which results in a phenomenon of slippage (displacement) in which planes of crystals are displaced. If the structure of the semiconductor substrate 60 according to the embodiment 1 is set, such a phenomenon that a middle part of the semiconductor substrate 60 is lowered can be prevented according to the presence of the reinforcing part 50, which can improve yield.

As mentioned above, as explained with reference to FIG. 3 through FIG. 5, by performing manufacture of semiconductor devices by using the semiconductor substrate 60 according to the present embodiment, the manufacturing cost is reduced, and yield can be improved.

Figure 6:
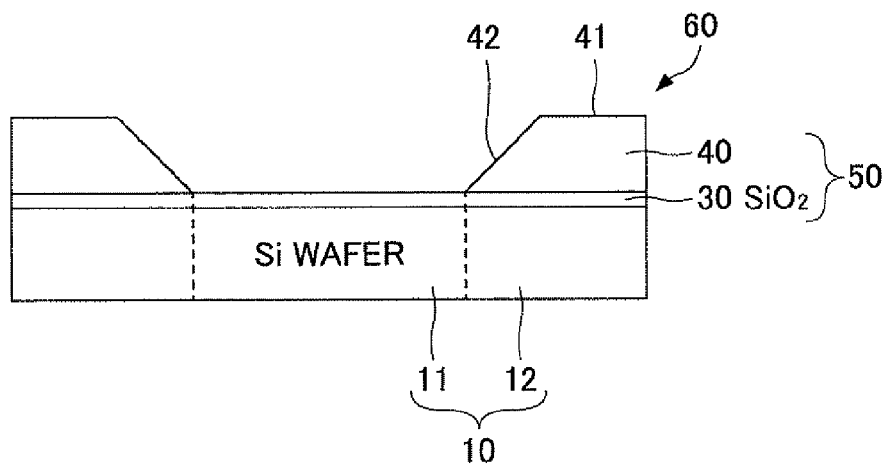
FIG. 6 is a view illustrating an example of a cross-sectional structure of the semiconductor substrate according to the embodiment 1.

Next, a description is given, with reference to FIG. 6, of the structure of the semiconductor substrate 60 according to the embodiment 1 in further detail. FIG. 6 is a view illustrating an example of a cross-sectional structure of the semiconductor substrate 60 according to the embodiment 1. In FIG. 6, the semiconductor substrate 60 according to the embodiment 1 is illustrated with specific illustration of a joint part between the reinforcing ring 40 and the semiconductor substrate 10 to be reinforced. Other structures are the same as FIG. 1, and descriptions thereof will be omitted.

In FIG. 6, the semiconductor substrate 60 according to the embodiment 1 has an oxidation film 30 formed between the reinforcing ring 40 and the semiconductor substrate 10 to be reinforced. Because the semiconductor substrate 10 to be reinforced and the reinforcing ring 40 are constituted as separate members in the semiconductor substrate 60 according to the present embodiment, surfaces of both can be oxidized individually to generate the oxidation film 30. Then, a heat treatment is performed while the oxidation films 30 are overlapped with each other, which results in the oxidation films 30 being joined to each other. The semiconductor substrate 60 according to the embodiment 1 uses such a joint between the oxidation films 30 to join the reinforcing ring 40 to the outer circumference part 12 of the semiconductor substrate 10 to be reinforced and form the reinforcing part 50. Accordingly, the cross-sectional structure of the reinforcing part 50 is a sandwich-like three-layer structure in which the oxidation film 30 is formed at a position on the front surface of the semiconductor substrate 10 to be reinforced and the semiconductor layer is formed on the oxidation film 30.

In addition, a thickness of 6-inch semiconductor wafer specified in the SEMI standard is 625 μm, and the semiconductor substrate 60 according to the present embodiment is suitable for a case where the semiconductor substrate 10 to be reinforced is thinner than 625 μm.

Moreover, the inner side surface 42 of the reinforcing ring 40 has a shape to linearly connect the top part 41 and the surface of the semiconductor device formable area 11. Such a shape can be easily formed by machining.

Thus, according to the semiconductor substrate 60 according to the embodiment 1, the reinforcing part 50 can be formed by using the oxidation film 30 by using the reinforcing ring 40 formed as a separate member to reduce a manufacturing cost, and can be constituted as a semiconductor substrate for which conveyance and heat treatment can be performed appropriately.

Figure 7A:
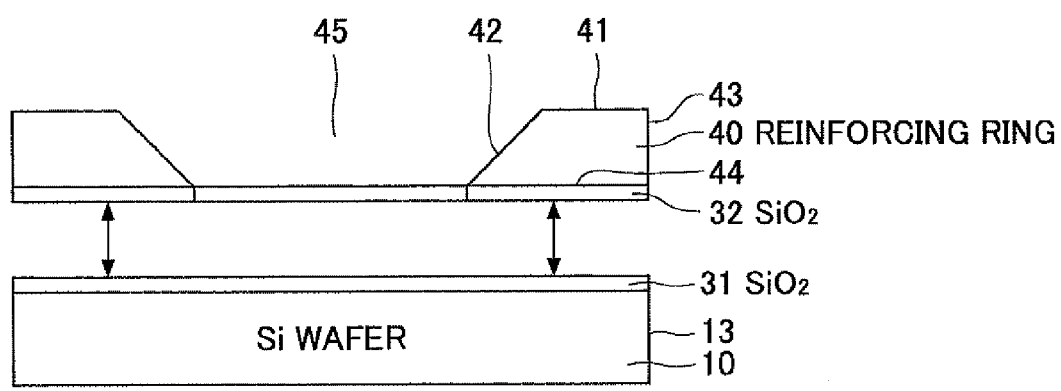
FIG. 7A is an illustration illustrating an example of a positioning process of a manufacturing method of the semiconductor substrate according to the embodiment 1.
Figure 7B:
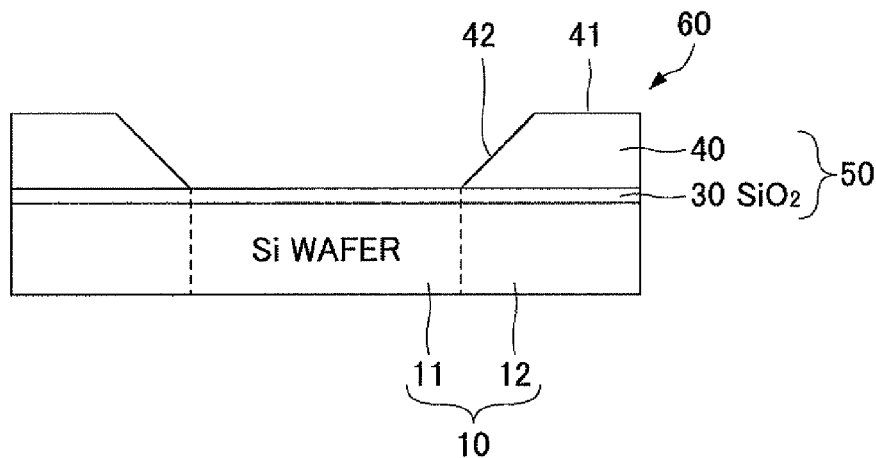
FIG. 7B is an illustration illustrating an example of a laminating process of the manufacturing method of the semiconductor substrate according to the embodiment 1.

Next, a description is given, with reference to FIG. 7A and FIG. 7B, of an example of the manufacturing method of the semiconductor substrate 60 according to the embodiment 1. FIG. 7A and FIG. 7B are illustrations illustrating an example of a manufacturing method of the semiconductor substrate 60 according to the embodiment 1.

FIG. 7A is an illustration illustrating an example of a positioning process of the manufacturing method of the semiconductor substrate 60 according to the embodiment 1. In FIG. 7A, the semiconductor substrate 10 to be reinforced having the oxidation film formed on the surface is prepared. Although a substrate formed of various semiconductors may be applied to the semiconductor substrate 10 to be reinforced, a description is given of an example to which a silicon substrate is applied in FIG. 7A. When a silicon substrate is used for the semiconductor substrate 10 to be reinforced, the oxidation layer 31 is made of $SiO_2$.

A reinforcing ring 40 is provided above the semiconductor substrate 10 to be reinforced. As explained with reference to FIG. 1, the reinforcing ring 40 has the top part 41 and is an annular member having an opening 45 at the center. Although a member formed of various semiconductors may be applied to the reinforcing ring 40 similar to the semiconductor substrate 10 to be reinforced, a description is given of an example of the reinforcing ring 40 formed of a silicon material in FIG. 7A similar to the semiconductor substrate 10 to be reinforced. An oxidation layer 32 is formed on the bottom surface 44 of the reinforcing ring 40, and is in a joinable state with the semiconductor substrate 10 to be reinforced. Moreover, the inner side surface 42 of the opening 45 of the reinforcing ring 40 has a cross-sectional shape of which inner circumference is reduced as it goes from the top surface 41 to close to the bottom surface 44, and is configured to be as an inclined surface having a funnel shape. The inner side surface 42 has a cross-sectional shape, which connects linearly the inner side of the top part 41 and the inner side of the bottom surface 44. Because such a shape can be easily formed by machining, the reinforcing ring 40 can be easily formed. Moreover, the outer side surface 43 serving as an outer circumference edge is configured to be coincident on the outer circumference end part 13 of the semiconductor substrate 10 to be reinforced.

The reinforcing ring 40 is positioned so that the bottom surface 44 on which the oxidation layer 32 is formed is opposite to the surface of the semiconductor substrate 10 to be reinforced on which the oxidation film 31 is formed and the outer side surface 43 is coincident with the outer circumference end part 13 of the semiconductor substrate 10 to be reinforced, and is overlapped with the semiconductor substrate 10 to be reinforced.

FIG. 7B is an illustration illustrating a laminating process of the manufacturing method of the semiconductor substrate according to the embodiment 1. In FIG. 7B, after the oxidation layer 32 of the bottom surface of the reinforcing ring 40 and the oxidation layer 31 of the surface of the semiconductor substrate 10 to be reinforced are positioned and overlapped with each other, a heat treatment is performed by applying heat so as to join the oxidation film 31 and the oxidation film 32. The heating temperature of the heat treatment may be, for example, about 1000° C. It is considered that the joining of the oxidation layers 31 and 32 is achieved according to covalent bonding, so that the joining is achieved with a sufficiently strong joining force.

Although the surface of the semiconductor device formable area 11 in the semiconductor substrate 60 completed by the laminating process is in a covered state by the oxidation film 30, when forming a semiconductor device actually, the semiconductor device may be formed after removing the oxidation film 30. Because the semiconductor device formable area 11 can be formed in a thin-type of about 300 μm, it is possible to manufacture a semiconductor device of which manufacturing cost is reduced. Moreover, because the reinforcement part 50 has a thickness to which the thickness of the reinforcing ring 40 is added and it can be a thickness equal to or larger than 500 μm, for example, about 600 μm, slippage can be prevented during handling in conveyance in the manufacturing process of the semiconductor device and the heat treatment.

Figure 8:
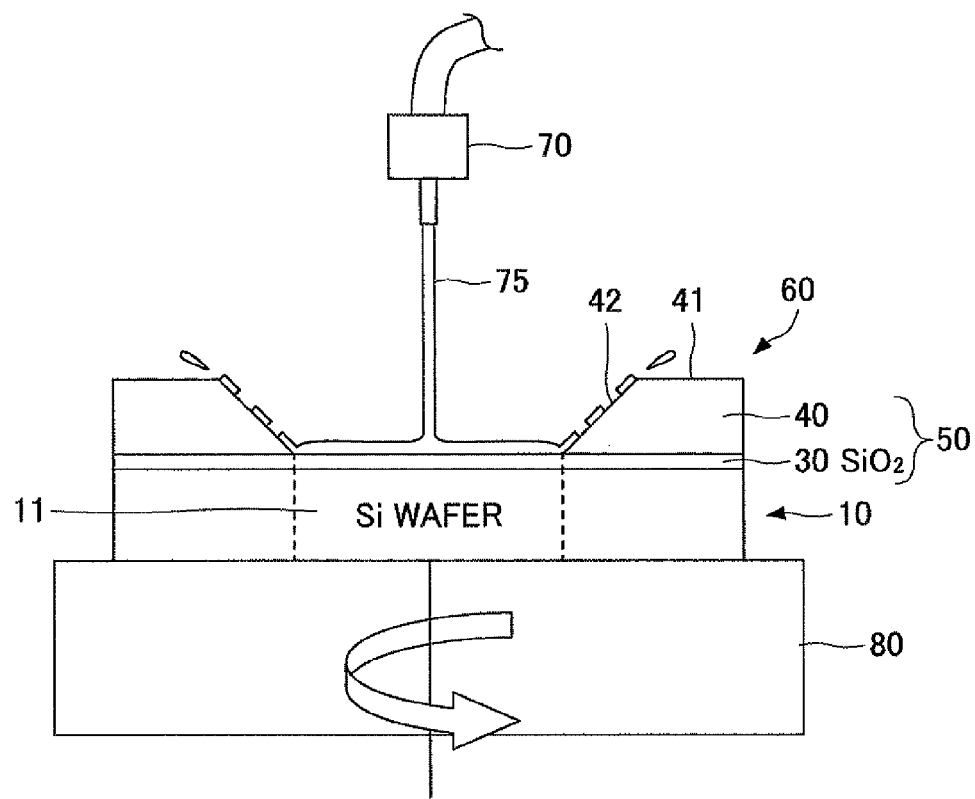
FIG. 8 is an illustration illustrating the FIG. having shown an example of the manufacture method of a semiconductor device using the semiconductor substrate concerning an embodiment 1.

Next, a description is given, with reference to FIG. 8, of an example of the manufacturing method of the semiconductor device using the semiconductor substrate 60 according to the embodiment 1. FIG. 8 is an illustration illustrating an example of the manufacturing method of the semiconductor device using the semiconductor substrate 60 according to the embodiment 1, and illustrating an example of a film forming process.

In FIG. 8, the semiconductor substrate 60 according to the embodiment 1 is placed on a stage 80. A process liquid 75 is supplied to the center part of the semiconductor substrate 60 from a nozzle as a process liquid supply means in a state where the stage 80 is rotated and the placed semiconductor substrate 60 is rotated. Because the surface of the semiconductor device formable area 11 and the inner side surface 42 formed by the reinforcing ring 40 of the semiconductor substrate 60 are inclined surfaces having a cross-sectional shape opening outward, the processing liquid can move upward on the inner side surface 42 and reach the top part 41. If the inner side surface 42 is in an almost perpendicular state, the processing liquid 75 cannot go beyond the inner side surface 42 and remains on the concave surface, but the semiconductor substrate 60 according to the embodiment 1 has the inclined surface on which the processing liquid 75 can move by a centrifugal force generated by rotation. Thus, by rotating the semiconductor substrate 60, the supplied processing liquid can be spun off, and, thereby, a film formed by the processing liquid can be adjusted to have a desired thickness.

In addition, it is desirable to set an angle of the inclined surface formed by the inner side surface 42 to 60 degrees or smaller relative to the surface of the semiconductor device formable area 11, which is a horizontal surface, and more preferably be set to 45 degrees or smaller, and most preferably be 30 degrees or smaller.

Moreover, the processing liquid 75 used for the semiconductor device manufacturing process may be a resist liquid used for forming, for example, a resist film, or may be a spin-on glass agent used for forming a spin-on glass film, or may be a processing liquid used for forming a polyimide passivation film.

Thus, according to the manufacturing method of a semiconductor device using the semiconductor substrate 60 according to the embodiment 1, a film can be formed on the semiconductor substrate 60 and a process such as patterning can be performed in the same manner as a normal semiconductor wafer of a completely planar form.

Embodiment 2

Figure 9:
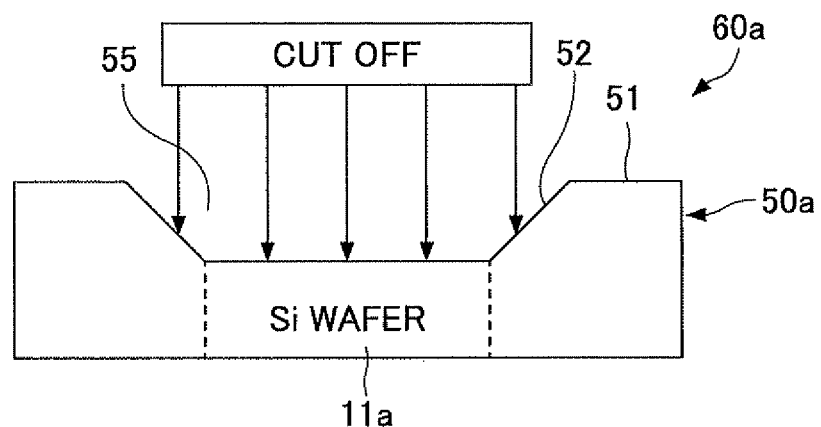
FIG. 9 is an illustration illustrating an example of a cross-sectional structure of a semiconductor substrate according to an embodiment 2.

FIG. 9 is an illustration illustrating an example of a cross-sectional structure of a semiconductor substrate 60a according to the embodiment 2 of the present invention. In FIG. 9, the semiconductor substrate according to the embodiment 2 is the same as the semiconductor substrate 60 according to the embodiment 1 in that the semiconductor substrate 60a has a semiconductor device formable area 11a in the center and a reinforcing part 50a, which is thicker than the semiconductor device formable area 11a to surround the semiconductor device fox gable area 11a. However, the semiconductor substrate 60a according to the embodiment 2 differs from the semiconductor substrate 60 according to the embodiment 1 in that the semiconductor substrate 60a does not have the semiconductor substrate 10 to be reinforced and the reinforcing ring 40 and is constituted by a single sheet of semiconductor wafer.

Thus, the semiconductor substrate 60 may be formed by scraping a single sheet of semiconductor wafer. The semiconductor substrate 60a according to the embodiment 2 has the same shape as the semiconductor substrate 60 according to the embodiment 1 in an external view. That is, the semiconductor device formable area 11a is formed in the central part of the semiconductor substrate 60a, and a reinforcing part 50a surrounds the periphery of the semiconductor device formable area 11a. The semiconductor device formable area 11a is thinner than 625 μm of SEMI standard, and, for example, may have a thickness of 300 μm or less. Additionally, the reinforcing part 50a may be formed with a thickness of 500 μm or more, and, for example, about 600 μm.

An opening 55 is formed above the surface of the semiconductor device formable area 11e, and it has a concave-type cross-sectional shape as a whole. A top part 51 of a flat surface exists on the surface of the reinforcement part 50a, and an inner side surface 52 of the opening 55 has a cross-sectional shape in which an inner diameter of the inner side surface 52 of the opening 55 is reduced from the top part 51 to the semiconductor device formable area 11e. Thereby, in the film forming process of the manufacture process of forming a semiconductor device in the semiconductor device formable area 11e of the semiconductor substrate 60a, the processing liquid can be spun off by rotation, which enables formation of a film with an appropriate film thickness.

The internal structure of the semiconductor substrate 60a according to the embodiment 2 differs from the semiconductor substrate 60 according to embodiment 60 in that the oxidation film 30 is not formed. The semiconductor substrate 60a according to the embodiment 2 is manufactured according to a manufacturing method which does not join the semiconductor substrate 10 to be reinforced and the reinforcing ring 40 but forms the opening 55 by scraping a central part of a semiconductor wafer having the thickness of the reinforcing part 50a. Thereby, an oxidation film for joining is not necessary, and an entire part is formed by a unified semiconductor material. It should be noted that various kinds of semiconductor materials such as silicon, SiC, etc., may be used for the semiconductor material of the semiconductor substrate 60a.

In order to manufacture the semiconductor substrate 60a, it is necessary to perform scraping so that a semiconductor wafer having a thickness of 500 μm or more is processed to have a thickness of 300 μm or less. Such a processing may be performed by normal machining or may be performed by dry etching such as reactive ion etching.

According to the semiconductor substrate 60a according to the embodiment 2, the semiconductor substrate 60a can be formed from only a single piece semiconductor material.

Embodiment 3

Figure 10:
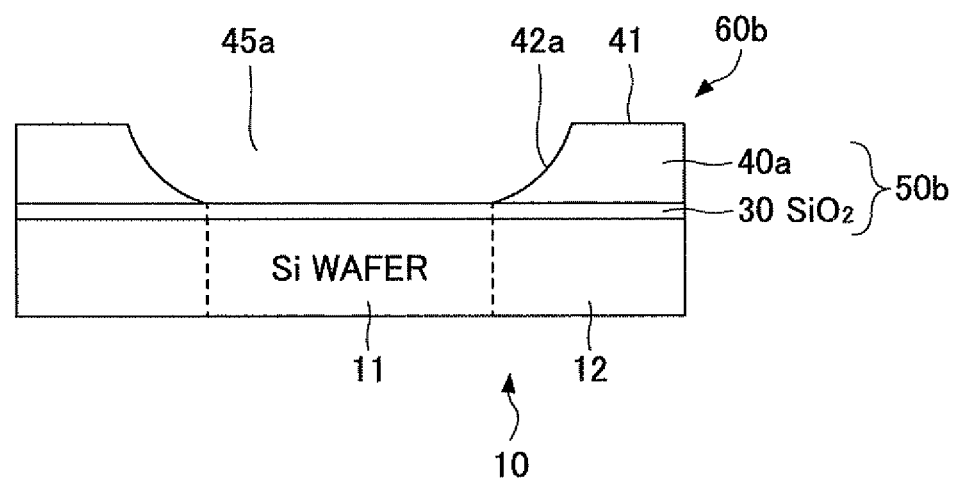
FIG. 10 is an illustration illustrating an example of a cross-sectional structure of a semiconductor substrate according to an embodiment 3.

FIG. 10 is an illustration illustrating an example of a cross-sectional structure of a semiconductor substrate 60b according to an embodiment 3 of the present invention. In FIG. 10, structural elements the same as that of the semiconductor substrate 60 according to the embodiment 1 are given the same reference numerals.

The semiconductor substrate 60b according to the embodiment 3 is the same as the semiconductor substrate 60 according to the embodiment 1 in that the semiconductor substrate 60b is formed of two members, the semiconductor substrate 10 to be reinforced and the reinforcing ring 40a. Also, the semiconductor substrate 60b according to the embodiment 3 is the same as the semiconductor substrate 60 according to the embodiment 1 in that a reinforcing part 50b of a three-layered structure is formed by the reinforcing ring 40a, the oxidation film 30 and the outer circumference part 12 of the semiconductor substrate 10 to be reinforced. The semiconductor substrate 60b according to the embodiment 3 differs from the semiconductor substrate 60 according to the embodiment 1 in that an inner side surface 42a of an opening 45a of a reinforcing ring 40a does not have a cross-sectional shape to linearly connect the top part 41 and the surface of the semiconductor device formable area 11 but has a curved side surface shape of which inclination is reduced as it goes from the top part 41 to closer to the semiconductor device formable area 11.

Thus, the inner side surface 42a of the reinforcing ring 40a may be configured to have a curved side surface shape. As illustrated in FIG. 10, it is desirable that the inclination of the inner side surface 42a becomes gentler and the inner side surface 42a approximates a flat surface as it goes closer to the semiconductor device formable area 11. This is because, in a film forming process of the semiconductor device manufacturing process of forming a semiconductor device, the processing liquid 75 can move upward easier on the inner side surface 42a as the periphery of the semiconductor device formable area 11 to which the processing liquid 75 is supplied is closer to a flat surface and the processing liquid can be easily spun off by rotation.

In addition, the inner side surface of the reinforcing ring 40a of the semiconductor substrate 60b according to the embodiment 3 may be performed by, for example, wet-etching. A cross-sectional structure of a cup shape can be made by wet-etching so that the inclination angle becomes smaller as it goes closer to the bottom surface of the reinforcing ring 40a.

In the manufacturing method of the semiconductor substrate 60b according to the embodiment 3, the reinforcing ring 40a and the semiconductor substrate 10 to be reinforced may be joined by the oxidation film 30 similar to the semiconductor substrate 60 according to the embodiment 1. A description of such a manufacturing method is omitted because the semiconductor substrate 60b can be manufactured by the same manufacturing method as the semiconductor substrate 60 according to the embodiment 1 with mere a difference in that the cross-sectional shape of the inner side surface 42a of the reinforcing ring 40a differs from that of the semiconductor substrate 60 according to embodiment 1.

In addition, as another manufacturing method of the semiconductor substrate 60b according to the embodiment 3, the completed annular reinforcing ring 40a is not joined to the semiconductor substrate 10 to be reinforced but forming the opening 45a by wet-etching a central part of one side surface of an SOI (Silicon On Insulator) substrate to manufacture the semiconductor substrate 60b. Because the oxidization film 30 acts as a terminal point of the wet etching, the cup-shaped opening 45a can be formed by the wet-etching process at the central part of one side so as to manufacture the semiconductor substrate 60b.

According to the semiconductor substrate according to the embodiment 3, the thin-type semiconductor substrate 60b, which is easily handled, can be realized by using wet-etching.

Embodiment 4

Figure 11:
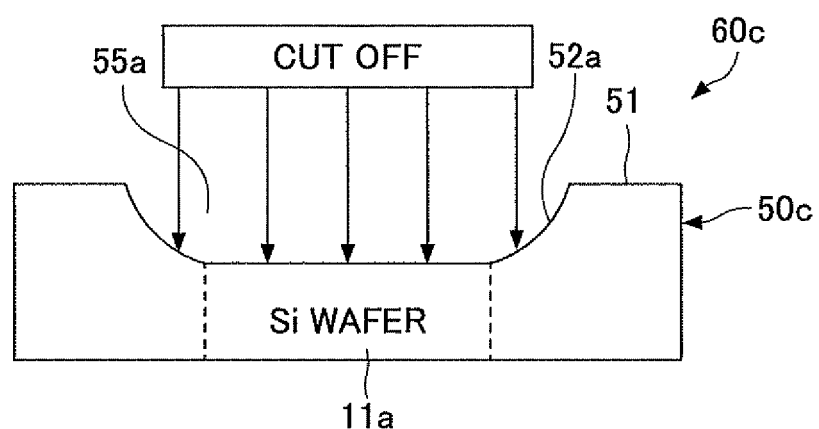
FIG. 11 is an illustration illustrating an example of a cross-sectional structure of a semiconductor substrate according to an embodiment 4.

FIG. 11 is an illustration illustrating a cross-sectional structure of a semiconductor substrate 60c according to an embodiment 4 of the present invention. In FIG. 11, the semiconductor substrate 60c according to the embodiment 4 is the same as the semiconductor substrate 60a according to the embodiment 2 in that the semiconductor substrate 60c is formed of a single sheet of semiconductor wafer. The semiconductor substrate 60c according to the embodiment 4 differs from the semiconductor substrate 60a according to the embodiment 2 in that an inner side surface 52a of an opening 55a of a reinforcing part 50c has a cup-shaped cross-sectional shape so that an inclination thereof becomes smaller as it goes closer to the semiconductor device formable area 11a. It should be noted that in the semiconductor substrate 60c according to the embodiment 4, structural elements the same as that of the semiconductor substrates 60, 60a and 60b according to the embodiments 1 through 3 are given the same reference numerals, and descriptions thereof will be omitted.

In the semiconductor substrate 60c according to the embodiment 4, similar to the semiconductor substrate 60b according to the embodiment 3, because the connection between the semiconductor device formable area 11a and the inner side surface 52a of the reinforcing part 50c has a very gentle inclination, the spin-off of the processing liquid 75 by rotation can be performed easily. It is the same as the semiconductor substrate 60a according to the embodiment 3 in an external view, the same action and effect can be obtained.

It should be noted that in the manufacturing method of the semiconductor substrate 60c according to the embodiment 4, for example, the processing of the inner side surface 52a may be performed by wet-etching and the cut-off of other portions may be performed by machining, dry-etching or the like.

According to the semiconductor substrate 60c according to the embodiment 4, a semiconductor device of which spun-off of the processing liquid can be easily performed can be manufactured from a single sheet of semiconductor wafer at a low-cost and the semiconductor substrate 60c, which is easily handled, van be obtained.

Embodiment 5

Figure 12:
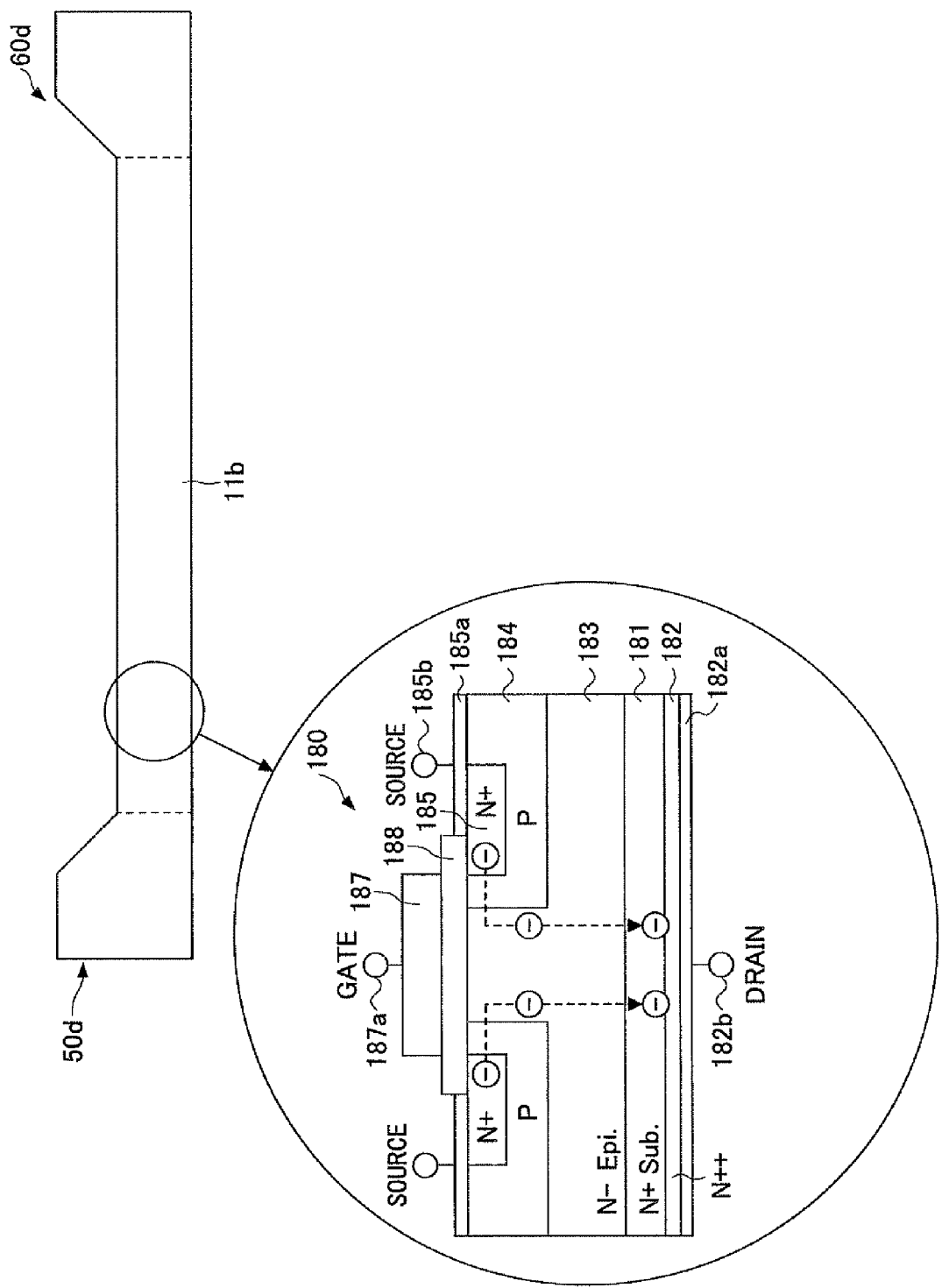
FIG. 12 is an illustration illustrating an example of a cross-sectional structure of a semiconductor substrate according to an embodiment 5.

FIG. 12 is an illustration illustrating a cross-sectional structure of a semiconductor device according to an embodiment 5 of the present invention. As illustrated in FIG. 12, the semiconductor device 180 according to the embodiment 5 is formed in a semiconductor device formable area 11b of a semiconductor substrate 60d, which includes a reinforcing part 50d and the semiconductor device formable area 11b. The semiconductor substrate 60d may be a semiconductor substrate to which one of the semiconductor substrates 60, 60a, 60b and 60c is applied, or various kinds of semiconductor substrates may be used if the reinforcing part 50d thicker than the semiconductor device formable area 11b is formed in the outer circumference part of the semiconductor substrate 60d.

The semiconductor device 180 according to the embodiment 5 formed in the semiconductor device formable area 11b is an N-channel MOS transistor of a planar structure. The semiconductor device 180 includes a drain area 181, a high-concentration diffusion area 182, a drain metal 182a, a drain electrode 182b, a low-concentration N layer 183, a channel 184, a source area 185, a source metal 185a, a source electrode 185b, a gate 187, a gate electrode 187a, and an oxidization film 188.

The drain are 181 is constituted by an N+ semiconductor substrate containing impurities of N+. The N+ semiconductor substrate may be formed of a semiconductor material such as, for example, silicon, SiC, etc. In addition, in the present embodiment, a substrate, which is formed of a single material containing impurities of N+ and no growth layer such as the low-concentration N layer 183 is formed on the surface, is referred to as an N+ semiconductor substrate, and a substrate in which a growth layer such as the low-concentration N layer 183 is formed is referred to as the semiconductor substrate 60d.

The high-concentration diffusion area 182 is formed on the N+ semiconductor substrate, that is, the back surface of the semiconductor substrate 60d. The high-concentration diffusion area 182 is an impurity diffusion area of the N-type, which is the same conductive type as the N+ semiconductor substrate, and has an impurity concentration of N++, which is higher than the impurity concentration N+ of the N+ semiconductor substrate. The high-concentration diffusion area 182 is a diffusion area formed by implanting impurities from the back surface side of the N+ semiconductor substrate and thermal-diffusing the impurities, and a conductivity is raised by setting a high concentration of the impurity concentration to achieve a good electrical connection with the drain metal 182a. The drain metal may be formed of a metal film formed by sputtering or the like. Additionally, the drain electrode 182b enables an application of a voltage to the drain area 181 from an external part.

The low-concentration N layer is an N-type semiconductor layer, which is epitaxially grown on a surface of the N+ semiconductor substrate. The low-concentration N layer 183 has an N− impurity concentration lower than the drain area 181. The channel 184 is a diffusion layer formed on the front surface side of the low-concentration N layer 183, that is, the front surface side of the semiconductor substrate 60d. The channel 184 is a P-type diffusion layer, which covers the source area 185 from underneath and the sides, and serves as a passage route of carriers when the semiconductor device is in operation.

The source area is a diffusion area formed on the surface of the semiconductor substrate 60d. The source area 185 may be formed with an N-type conductivity and impurity concentration. The source metal 185a is a conductive area for achieving an electrical connection between the source area 185 and an external part, and may be formed of a metal film formed by sputtering or the like. The source electrode 185a is an electrode for applying a voltage to the source area 185 from an external part. It should be noted that, though it is not illustrated, a high-concentration diffusion layer having a concentration higher than N+, for example, on the surface of the source area 185 in order to improve the electrical connection with the source metal 185a.

The gate 187 drives the semiconductor device 180 by being applied with a voltage. The gate 187 is formed on the surface of the semiconductor substrate 60d through the oxidization film 188. The gate 187 is configured to be capable of applying a voltage from an external part through the gate electrode 187a.

As mentioned above, because the semiconductor device 180 according to the embodiment 5 is constituted as a vertical-type MOS transistor, the diffusion layers 181, 182 and 185 are formed on both of the front surface and the back surface of the semiconductor device formable area 11b.

Next, a description is given of an operation of the semiconductor device 180. When a positive voltage is applied to the gate 187, the channel configured by a P-type diffusion layer is open, and a current flows from the drain area 181 to the source area 185, which causes the semiconductor device 180 to be in operation. In FIG. 12, because it is expressed by movement of electrons, the direction of movement of electrons from the source area 185 to the drain area 181, which is an opposite direction to the current, is indicated.

Thus, because a current flows in a direction of the thickness of the semiconductor substrate 60d in the vertical-type semiconductor device 180 in which diffusion layers are formed on both the front surface side and the back surface side of the semiconductor substrate 60d, the semiconductor device forming area 11b of the semiconductor substrate 60 is made thin and the semiconductor device 180 is formed on the semiconductor device formable area 11b, and, thereby, the ON resistance of the semiconductor device 180 is decreased and a process of forming the diffusion layers is made easy.

It should be noted that although a description has been given of the N-channel MOS transistor of a planar structure as an example with reference to FIG. 12, a P-channel MOS transistor may be used. Additionally, a description has been given of the example in which the low-concentration N layer 183 is formed as an epitaxial growth layer, it may be formed as a well layer.

Embodiment 6

Figure 13:
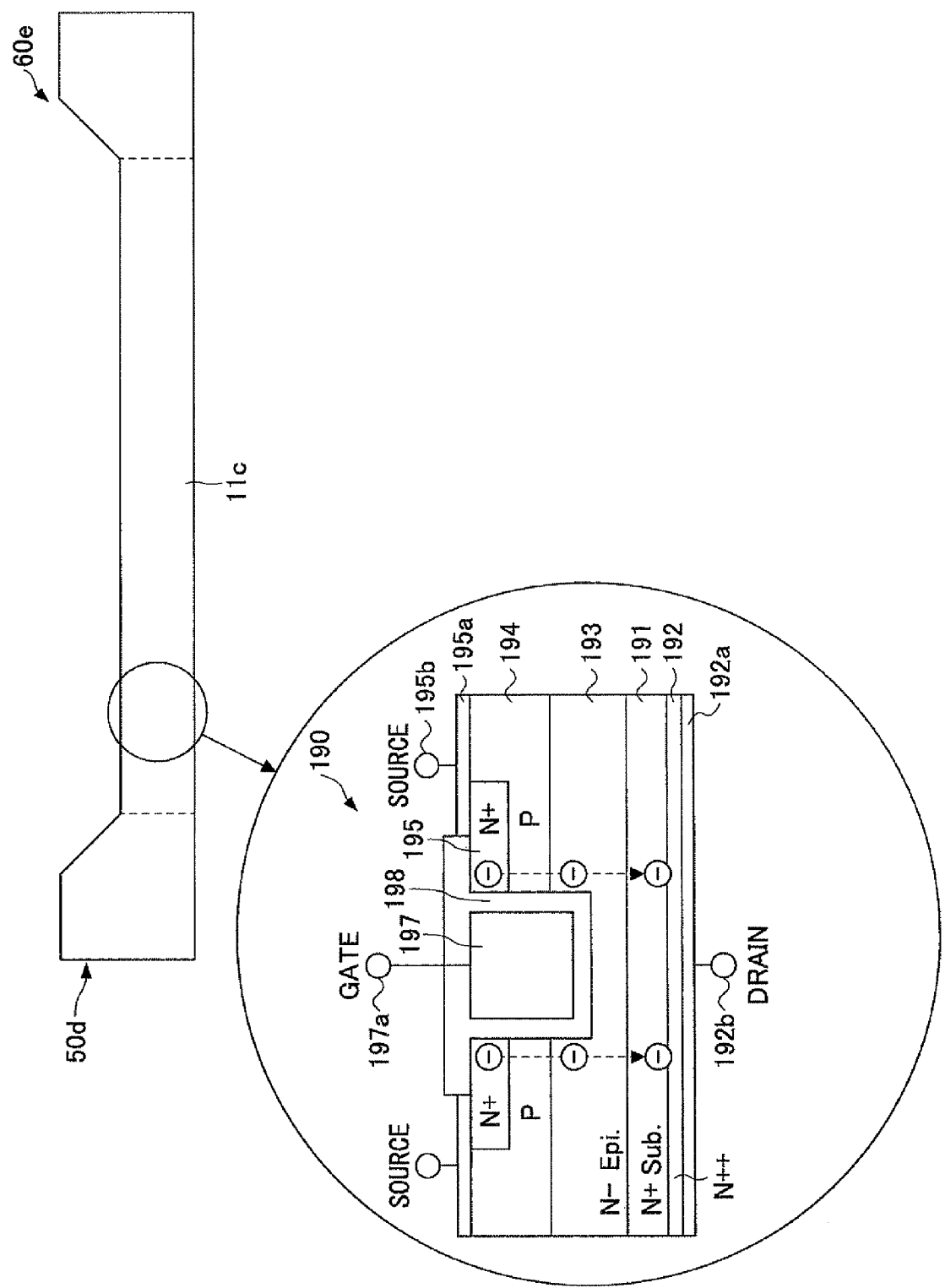
FIG. 13 is an illustration illustrating an example of a cross-sectional structure of a semiconductor substrate according to an embodiment 6.

FIG. 13 is an illustration illustrating an example of a cross-sectional structure of a semiconductor device 190 according to an embodiment 6 of the present invention. In FIG. 13, a semiconductor substrate 60e includes a semiconductor device formable area 11c in the central part and an outer circumference part 50d, and is configured to be a concave shape in which the thickness of the outer circumference part 50d is smaller than the thickness of the semiconductor device formable area 11c.

The semiconductor device 190 is constituted as an N-channel MOS transistor of a trench structure. The semiconductor device 190 is the same as the semiconductor device 180 according to the embodiment 5 in that the semiconductor device 190 includes a drain area 191, a high-concentration diffusion area 192, a drain metal 192a, a drain electrode 192b, a low-concentration N layer, a channel 194, a source area 195, a source metal 195a, a source electrode 195b, a gate 197, a gate electrode 197a, and an oxidization film 198. Additionally, the semiconductor device 190 is the same as the semiconductor device 180 according to the embodiment 5 in that diffusion layers 191, 192 and 195 are formed on both sides of the semiconductor device formable area 11c. The semiconductor device 190 according to the embodiment 6 differs from the semiconductor device 180 according to the embodiment 5 in that the gate 197 extends from the surface of the semiconductor substrate 60e in a direction of depth and is formed not on the surface of the semiconductor substrate 60e but within a trench inside the semiconductor substrate 60e. In association with this, the oxidation film 198 is configured to cover not only a lower part but also sides and an upper part of the gate 197 so that the gate 197 does not contact with the semiconductor substrate 60e.

As mentioned above, the gate 197 may be formed in the trench formed in the semiconductor substrate 60e so that the gate 197 is provided to extend in a vertical direction. Because the source area 195 is prevented from expanding in a transverse direction, the semiconductor device 190 can be formed with a space saving manner.

Other structural elements are the same as that of the semiconductor device 180 according to embodiment 5, and detailed descriptions thereof will be omitted.

Next, a description is given of an example of an operation of the semiconductor device 190 according to the embodiment 6. When a positive voltage is applied to the gate 197, the channel 194 underneath the source area 196 is open, and a current flows from the drain area 191 to the source area 195. In FIG. 13, a movement of carriers is illustrated by a flow of electrons, and a state where electrons are moving from the source area 195 to the drain area 191 is illustrated.

Thus, the N-channel MOS transistor of a trench structure may be formed in the semiconductor device formable area 11c of the semiconductor substrate 60e. In addition, the semiconductor device 190 is the same as the MOS transistor 180 according to the embodiment 5 in that the semiconductor device 190 can be configured as a P-channel MOS transistor and also a well layer may be formed instead of the low-concentration N layer 193.

Embodiment 7

Figure 14:
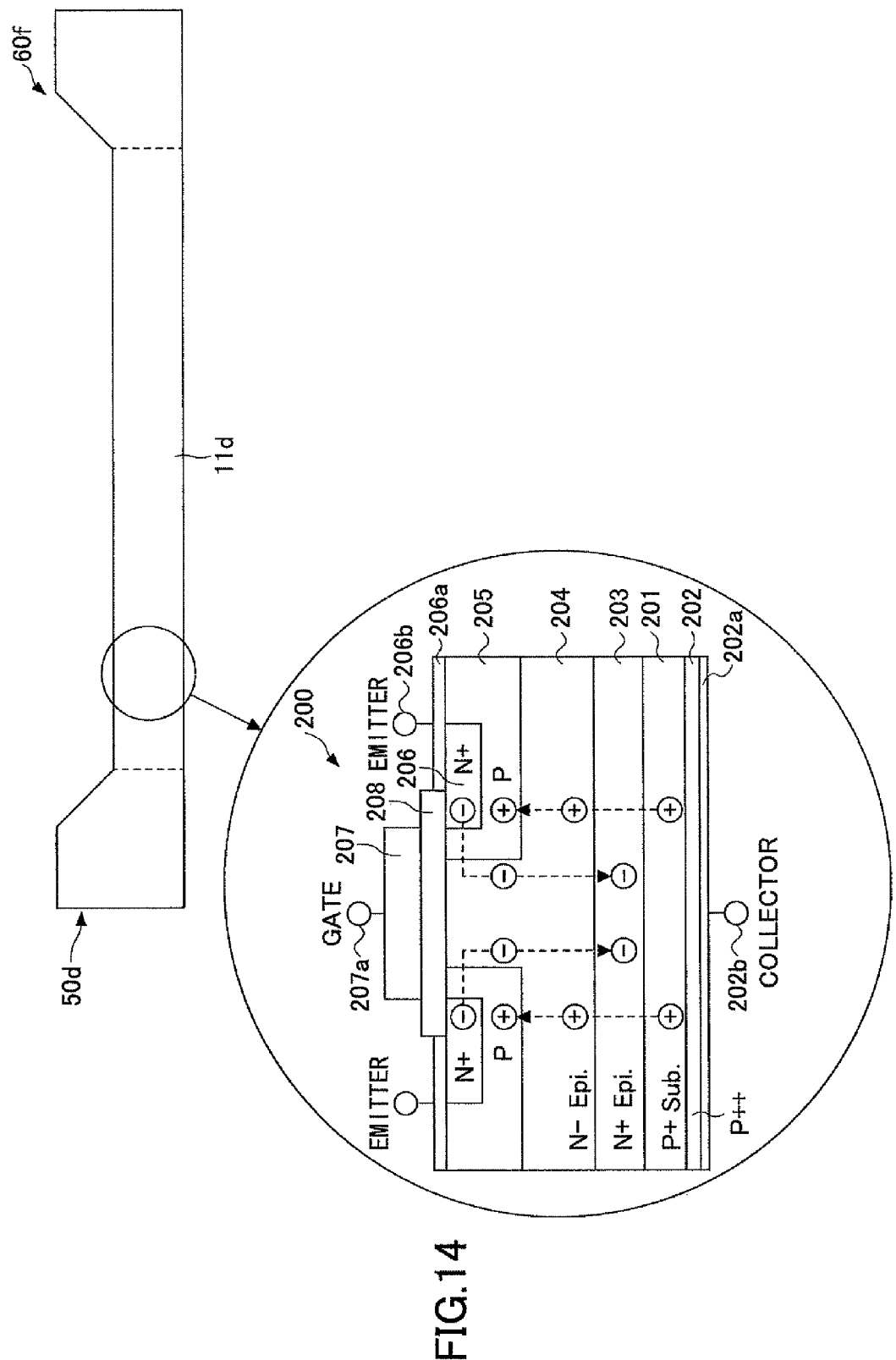
FIG. 14 is an illustration illustrating an example of a cross-sectional structure of a semiconductor substrate according to an embodiment 7.

FIG. 14 is an illustration of an example of a cross-sectional structure of a semiconductor device 200 according to an embodiment 7 of the present invention. In FIG. 14, a semiconductor substrate 60f is illustrated in which a semiconductor device formable area 11d is formed in the central part and a reinforcing part 50d is formed in an outer circumference part. The semiconductor device 200 according to the embodiment 7 is formed in the semiconductor device formable area 11d of the semiconductor-substrate 60f.

The semiconductor device 200 according to the embodiment 7 is constituted as an IGBT (Insulated Gate Bipolar Transistor, insulated bipolar transistor) of a planar structure. The semiconductor device 200 includes a collector area 201, a high-concentration diffusion area 202, a collector metal 202a, a collector electrode 202b, a high-concentration N layer 203, a low-concentration N layer 204, a channel 205, an emitter area 206, an emitter metal 206a, an emitter electrode 206b, a gate 207, and an oxidization film 208. Similar to the embodiments 5 and 6, diffusion layers 201, 202 and 206 are formed on both sides of the semiconductor device formable area 11d.

The collector area 201 is formed of a P+ semiconductor substrate having P-type impurity diffusion concentration of P+. Similar to the structure explained in the embodiment 5, the P+ semiconductor substrate is made from a single semiconductor material with a single conductive type and a single impurity concentration, and, for example, a silicon substrate or an SiC substrate may be used. The semiconductor device 200 is the same as the embodiments 5 and 6 in that, in order to improve conductivity, a high-concentration diffusion area 202, which is the same conductive type as the P+ semiconductor substrate and has an impurity concentration higher than the P+ semiconductor substrate, is formed on the back surface of the P+ semiconductor substrate, that is, the back surface of the semiconductor substrate 60f. It differs from the embodiment 6 in that the P+ semiconductor substrate of P-type is used in the embodiment 7, and, thereby, the high-concentration diffusion area 202 has an impurity concentration of P++. The collector metal 202a is provided to attempt an electrical connection with the high-concentration diffusion area 202. The collector metal 302a may be a metal film formed by sputtering or the like. Additionally, the collector metal 202 is connected to the collector electrode 202b to enable a power supply to the collector area 201 from an external part.

The high-concentration N layer 203 is an N-type diffusion layer formed on the surface of the P+ semiconductor substrate. The high-concentration N layer 203 may be formed as, for example, an epitaxial growth layer, or may be constituted as a well layer. In FIG. 14, an example in which it is configured as an epitaxial growth layer is illustrated.

The low-concentration N layer is an N-type diffusion layer formed on the high-concentration N layer 203 and having an impurity concentration lower than the high-concentration N layer 204. The low-concentration N layer 204 can also be formed by the same forming method as that of the high-concentration N layer 203, and may be formed as an epitaxial growth layer or a well layer. In FIG. 14, an example in which the high-concentration N layer 203 and the low-concentration N layer 204 are formed as epitaxial growth layers is illustrated.

The channel 205 is an area used as a passage route of carriers, and is configured as a P-type diffusion layer.

The emitter area 206 is formed on the front surface side of the semiconductor substrate 60f and constituted as a diffusion area having an N-type impurity concentration of N+. The emitter metal 206a is a conductive area provided to achieve an electrical connection between the emitter area 206 and an external part, and may be formed as, for example, a metal film. Additionally, the emitter electrode 206b is an electrode for supplying an electric power to the emitter area 206 from an external part. Although not illustrated in FIG. 14, a high-concentration diffusion area of N++, which has an impurity concentration higher than the emitter area and has an improved conductivity, may be formed on the surface of the emitter area 206.

The gate 207, the gate electrode 207a and the oxidization film 208 have functions to cause the semiconductor device 200 to drive by applying a voltage, similar to the semiconductor device 180 according to the embodiment 5. Those functions are the same as that of the gate 187, the gate electrode 187a and the oxidation film 188 of the embodiment 5, and descriptions thereof will be omitted.

Next, a description is given of an example of an operation of the semiconductor device 200 according to the embodiment 7. When a positive voltage is applied to the gate 207 through the gate electrode 207a, the channel 205 underneath the oxidation film 208 is open, and a current flows from the collector area 201 to the emitter area 206. In FIG. 14, because it is expressed by movement of electrons, a state where electrons are moving from the emitter area 206 to the collector area 201 is illustrated. Here, the channel 205 of a P layer, the low-concentration and high-concentration N layers 203 and 204 and the collector area 201 constituted by a P+ semiconductor substrate together constitute a parasitic PNP transistor, and a current flowing from the above-mentioned collector area 201 to the emitter area 206 corresponds to a base current of the parasitic PNP transistor. Accordingly, a flow of positive holes from the collector area 201 into the emitter area 206 is initiated by the base current, and a current flows from the collector area 201 to the emitter area 206. In FIG. 14, the above-mentioned current is illustrated in the same direction as the movement of the positive holes.

As mentioned above, in the IGBT, the parasitic PNP transistor is operated by opening the cannel 205 to cause a current flowing from the collector area 201 to the emitter area 206, which results in a further current flowing from the collector area 201 to the emitter area 206. Also in this case, because the direction of flow of the current is a direction of thickness of the semiconductor substrate 60f, the ON resistance can be decreased and formation of the diffusion layers in a manufacturing process can be made easy by making the semiconductor device formable area 11d of the semiconductor substrate 60f thin.

Embodiment 8

Figure 15:
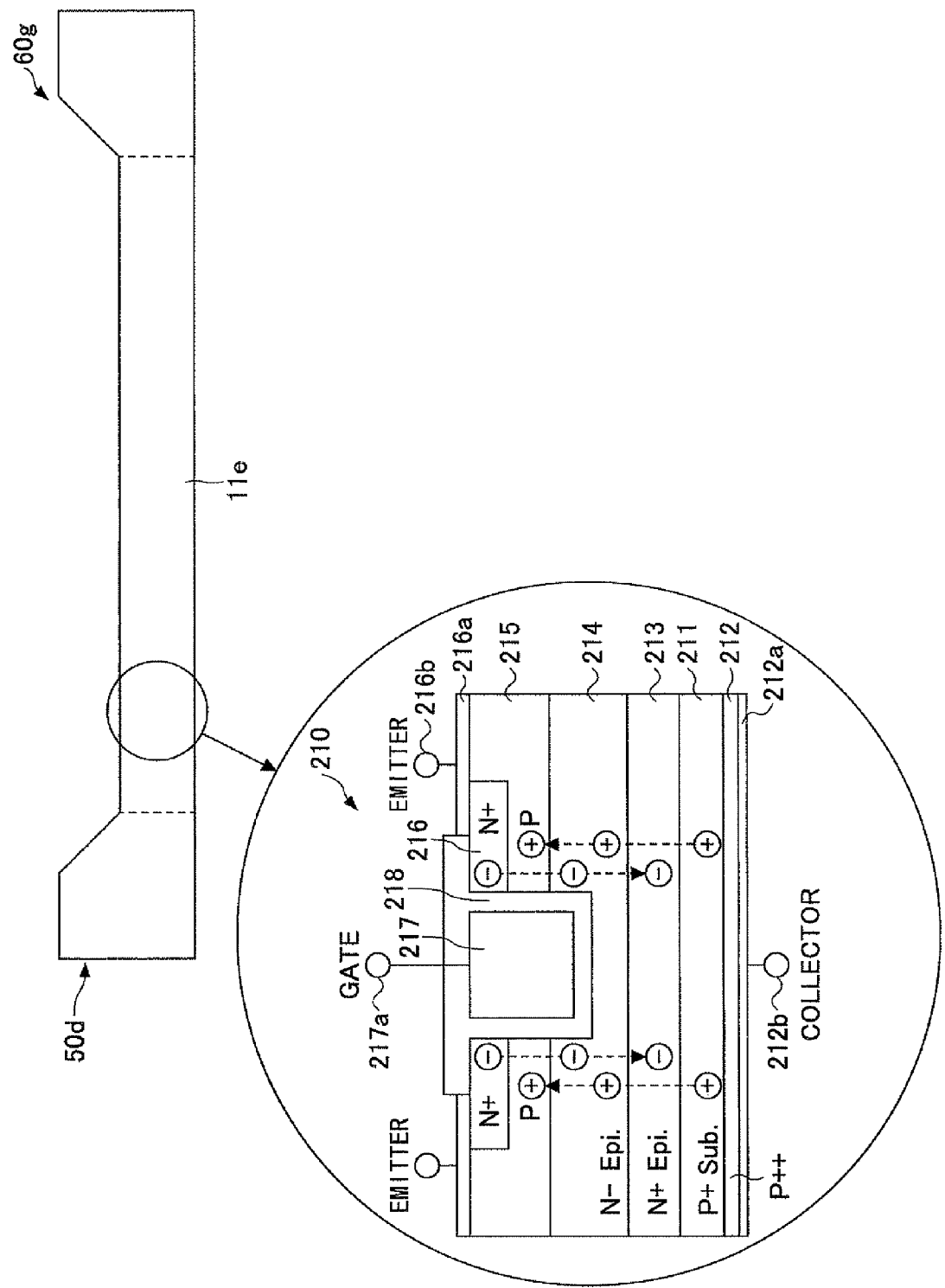
FIG. 15 is an illustration illustrating an example of a cross-sectional structure of a semiconductor substrate according to an embodiment 8.

FIG. 15 is an illustration of an example of a cross-sectional structure of a semiconductor device 210 according to an embodiment 8 of the present invention. The semiconductor device 210 according to the embodiment 8 is formed in a semiconductor device formable area 11e, which is formed in a semiconductor substrate 60g including the semiconductor device formable area 11e in the center part and a reinforcing part 50d in an outer circumference part, the reinforcing part 50d having a thickness smaller than the thickness of the semiconductor device formable area 11e.

The semiconductor device 210 according to the embodiment 8 is constituted as an IGBT of a trench structure. The semiconductor device 210 according to the embodiment 8 is the same as the semiconductor device 200 according to the embodiment 7 in that semiconductor device 210 includes a collector area 211, a high-concentration diffusion area 212, a collector metal 212a, a collector electrode 212b, a high-concentration N layer 213, a low-concentration N layer 214, a channel 215, an emitter area 216, an emitter metal 216a, an emitter electrode 216b, a gate 217, and an oxidization film 218. Similar to the embodiments 5 through 7, diffusion layers 211, 212 and 216 are formed on both sides of the semiconductor device formable area 11e.

The semiconductor device 210 according to the embodiment 8 differs from the semiconductor device 200 according to the embodiment 7 in that the gate 217 is formed in a trench formed in the semiconductor substrate 60g to extend not in a transverse direction, but in a direction of depth. Also the semiconductor device 210 according to the embodiment 8 differs from the semiconductor device 200 according to the embodiment 7 in that the gate 217 extends in the direction of depth of the semiconductor substrate 60g to cover not only a lower part of the gate 217 but also sides and an upper part of the gate 217 by the oxidation film 218 to prevent the gate 217 from directly contacting the semiconductor substrate 60g. Other structural elements are the same as that of the semiconductor device 200 according to the embodiment 7, and descriptions thereof will be omitted.

Next, a description is given of an example of an operation of the semiconductor device 210 according to the embodiment 8. When a positive voltage is applied to the gate 217, the channel 215 on the side of the gate 217 is open, and a current flows from the collector area 211 to the emitter area 216. In FIG. 15, a movement of electrons, which are carriers, is illustrated as opposite direction to the current. Here, it is the same as the semiconductor device 200 according to the embodiment 7 in that the channel 215 of a P layer, the low-concentration and high-concentration N layers 214 and 213 and the collector area 211 constituted by a P+ semiconductor substrate together constitute a parasitic PNP transistor. A current flowing from the collector area 211 to the emitter area 216 caused by the channel 215 being opened also corresponds to a base current of the parasitic PNP transistor, and, thereby, the parasitic PNP transistor is operated and positive holes move from the collector area 201 toward the emitter area 206, which causes a flow of a current.

As mentioned above, also in the case of the semiconductor device 210 according to the embodiment 8, which is an IGBT of a trench structure, a current flows in a direction of thickness of the semiconductor substrate 60g, and, thus, the ON resistance can be decreased and formation of the diffusion layers in a manufacturing process can be made easy by making the semiconductor device formable area 11d, in which the semiconductor device 210 is formed, thin.

Embodiment 9

FIG. 16A through FIG. 16K are illustrations illustrating an example of a semiconductor device according to an embodiment 9 of the present invention. In the embodiment 9, a description is given of an example of manufacturing methods of the semiconductor devices 180 through 210 according to the embodiment 5 through the embodiment 8.

Figure 16A:
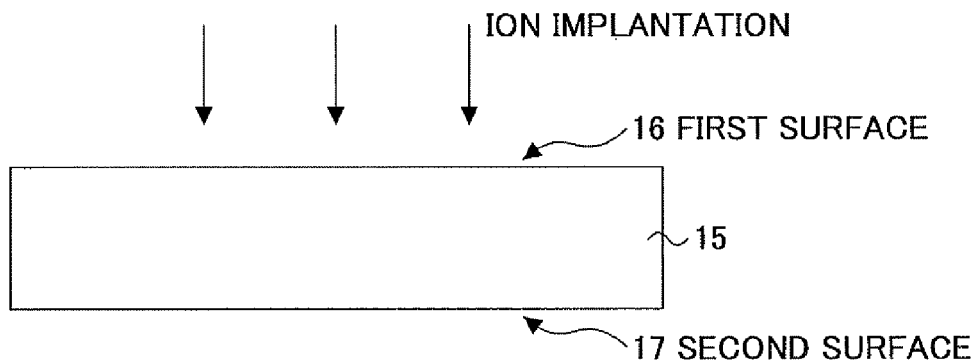
FIG. 16A is an illustration illustrating an example of a first diffusion layer forming process of a semiconductor device manufacturing method according to an embodiment 9.

FIG. 16A is an illustration illustrating an example of a first diffusion layer forming process of a manufacturing method of the semiconductor device according to the embodiment 9. In the first diffusion layer forming process, ions are implanted into a first surface 16 of a semiconductor substrate 15, and, thereafter, it is heated so that a first diffusion layer is formed on the first surface 16. Here, the semiconductor substrate 15 is a substrate formed of a single semiconductor material. Additionally, the first surface 16 is a surface usually referred to as a back surface of the semiconductor substrate 15.

In the first diffusion layer forming process, because the semiconductor substrate is in a state where it has not been processed at all and no semiconductor layer is formed, there is no restriction in temperature, pressure, etc., due to a semiconductor layer, and ion implantation and thermal diffusion can be performed sufficiently on the first surface 16. Additionally, because the semiconductor substrate 15 is also in a simple plate-form, ion implantation can be performed in a state where the semiconductor substrate is firmly fixed to a stage of an on implantation apparatus. Accordingly, it is possible to form a diffusion layer having a sufficiently high-concentration, which is extremely effective in forming a high-concentration diffusion layer having a high electric conductivity.

Figure 16B:
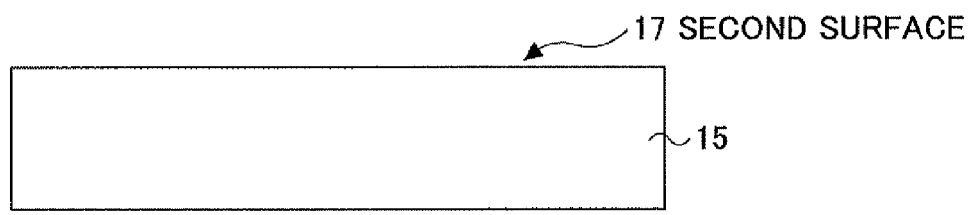
FIG. 16B is an illustration illustrating a state where a semiconductor substrate 15 is reversed.

FIG. 16B is an illustration illustrating a state where the semiconductor substrate is turned upside down. Thereby, the first surface 16 corresponds to a lower surface and a second surface 17, which is not subjected to ion implantation, corresponds to an upper surface.

Figure 16C:
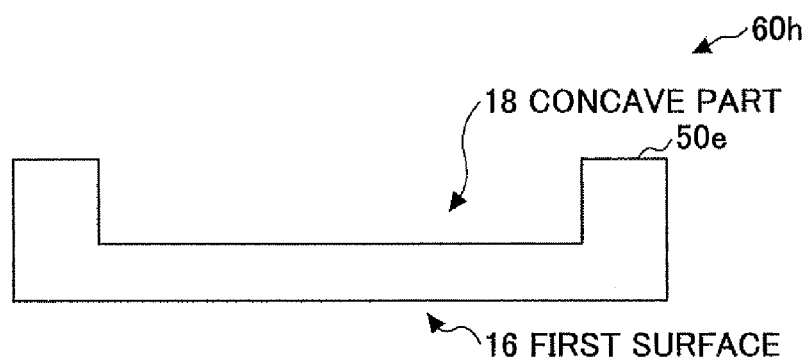
FIG. 16C is an illustration illustrating an example of a concave shape forming process of the semiconductor device manufacturing method according to the embodiment 9.

FIG. 16C is an illustration illustrating an example of a concave shape forming process of the manufacturing method of the semiconductor device according to the embodiment 9. In the concave shape forming process, a concave shape of which a central part is thin and an outer circumference part is thicker than the central part is formed in the second surface 17 of the semiconductor substrate 15. The concave shape may be formed according to various methods, and, for example, the method of joining oxidation films to each other explained with reference to FIG. 7A, FIG. 7B and FIG. 10 may be used, or the method of etching the semiconductor substrate 15 explained with reference to FIG. 9 and FIG. 11 may be used. Additionally, the concave shape may be formed by mechanical polishing such as grinding or polishing or chemical mechanical polishing.

It should be noted that, when the concave shape is formed in the second surface 17, a concave part 18, which is a surface of a recess, corresponds to the semiconductor device formable area and the outer circumference part corresponds to the reinforcing part 50e. Additionally, by the concave shape being formed, a semiconductor substrate 60h having the same shape as the semiconductor substrates 60 and 60a through 60g explained in the embodiment 1 through the embodiment 8 can be formed.

Figure 16D:
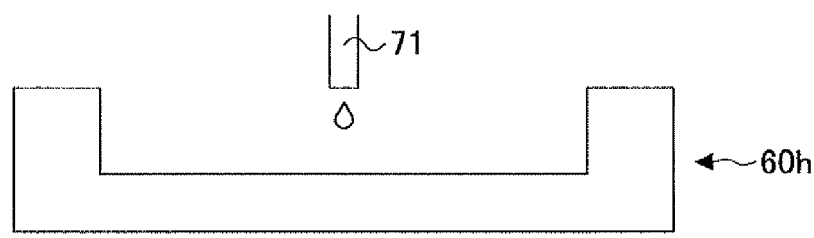
FIG. 16D is an illustration illustrating an example of a damage layer removing process of the semiconductor device manufacturing method according to the embodiment 9.

FIG. 16D is an illustration illustrating an example of a damage layer removing process of the manufacturing method of the semiconductor device according to the embodiment 9. The damage layer removing process is a process of removing a damage layer by etching when the damage layer is formed on the surface of the concave part 18, which is the semiconductor device formable area. The damage layer removing process may be provided, if necessary, when the damage layer is generated on the surface of the concave part 18. For example, when the concave shape forming process is carried out according to mechanical processing such as grinding, the surface of the concave part 18 becomes coarse, which results in a damaged state. In such a case, it is desirable to remove the damage layer of which surface is coarse by etching, and, thus, the damage layer removing process is performed.

The damage layer removing process may be performed by, for example, wet-etching or may be performed by dry-etching using plasma. In FIG. 16D, the wet-etching is illustrated as an example in which an etching liquid is supplied to the surface of the concave part 18 by a nozzle 71, and etching is performed by rotating the semiconductor substrate 60h. Besides, the damage layer may be removed by wet-etching of an immersion type, or the damage layer removing process may be performed according to various etching method.

Figure 16E:
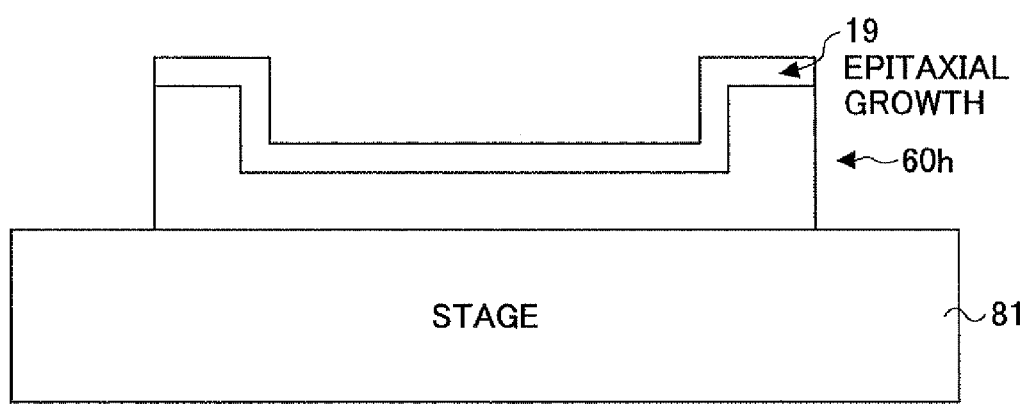
FIG. 16E is an illustration illustrating an example of a epitaxial growth process of the semiconductor device manufacturing method according to the embodiment 9.

FIG. 16E is an illustration illustrating an example of an epitaxial growth process of the manufacturing process of the semiconductor device according, to the embodiment 9. In the epitaxial growth process, an epitaxial growth layer 219 is formed in the concave part 18 of the semiconductor substrate 60h. The epitaxial growth process is performed while the semiconductor substrate 60h is fixed to a stage 81 of an epitaxial growth apparatus, and because the first surface 16 (back surface), which is a flat surface, is in contact with the stage, the epitaxial growth layer 19 can be formed in a state where the semiconductor substrate 60h is easily held and surely fixed on the stage 81.

Figure 16F:
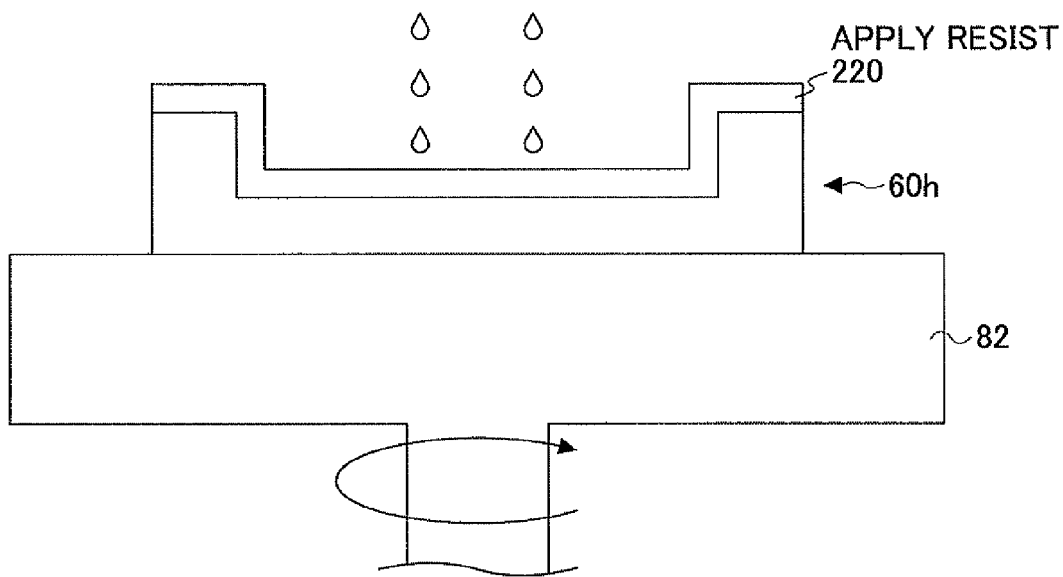
FIG. 16F is an illustration illustrating an example of a resist applying process of the semiconductor device manufacturing method according to the embodiment 9.

FIG. 16F is an illustration illustrating a resist applying process of the manufacturing method of the semiconductor device according to an embodiment 9. In the resist applying process, a resist 220 is supplied and applied on the second surface 17 of the semiconductor substrate 60h including the concave part 18. In this regard, the semiconductor substrate 60h is fixed to a stage 82 of a resist application apparatus, and because the first surface 16, which is a flat surface, is in contact with the stage 82, the resist 220 can be applied while surely fixing the semiconductor substrate 60h on the stage 82.

Figure 16G:
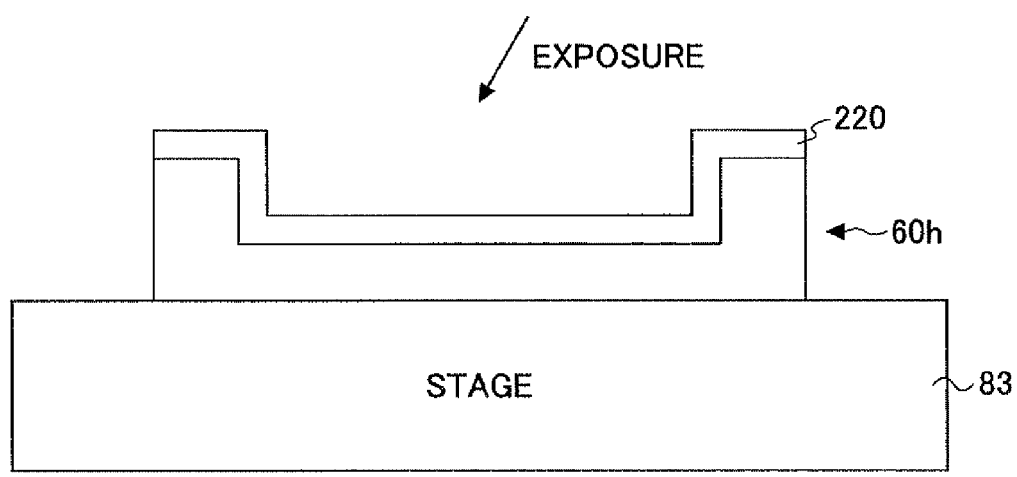
FIG. 16G is an illustration illustrating an exposing process of the semiconductor device manufacturing method according to the embodiment 9.

FIG. 16G is an illustration illustrating an example of an exposing process of the manufacturing method of the semiconductor device according to the embodiment 9. In the exposing process, the resist 220 applied on the second surface 17 of the semiconductor substrate 60h is exposed and a pattern is drawn on the resist 220. In this regard, the exposing process is carried out while the semiconductor substrate 60h is placed on a stage 83 of an exposure apparatus, and because the first surface 16, which is a flat surface, is brought into contact with the stage 83, the exposure can be carried out with high accuracy in a stable state.

Figure 16H:
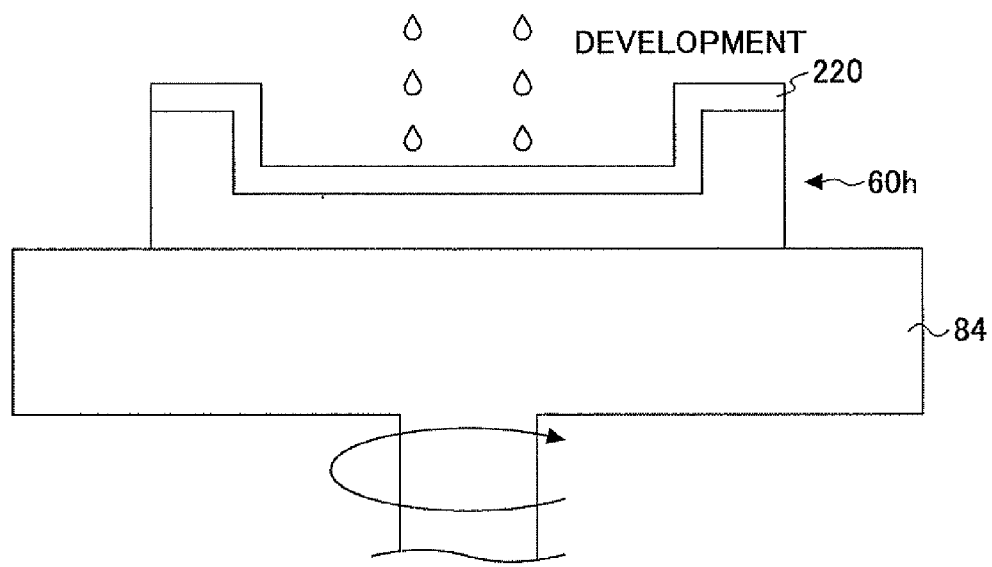
FIG. 16H is an illustration illustrating a developing process of the semiconductor device manufacturing method according to the embodiment 9.

FIG. 16H is an illustration illustrating an example of a developing process of the manufacturing method of the semiconductor device according to the embodiment 9. In the developing process, a developing liquid is supplied to the exposed resist 220, and an unnecessary part of the resist 220 is removed and a resist pattern is formed. In this regard, the semiconductor substrate 60h is placed on a stage of a development apparatus and the development is carried out, and because the first surface 16, which is a flat surface, is brought into contact with the stage 84, the development can be carried out easily in a stable state.

Figure 16J:
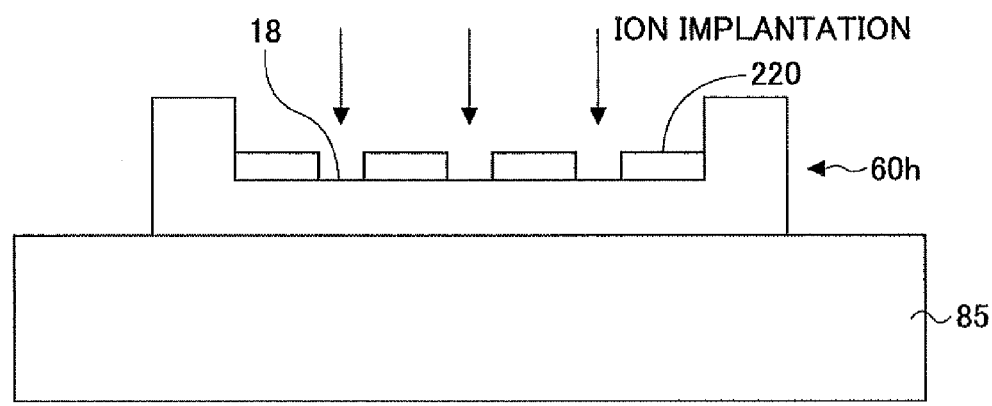
FIG. 16J is an illustration illustrating an example of a second diffusion layer forming process of the semiconductor device manufacturing method according to the embodiment 9.

FIG. 16J is an illustration illustrating an example of a second diffusion layer forming process of the manufacturing method of the semiconductor device according to the embodiment 9. In the second diffusion layer forming process, first, ion implantation is carried out from above the formed resist pattern 220 into the concave part 18 of the semiconductor substrate 60h. In this regard, as illustrated in FIG. 16J, the semiconductor substrate is placed on a stage while the first surface, which is a flat surface, is brought into contact with the surface of the stage 85. Accordingly, ions can be appropriately implanted into the surface of the concave part 18 formed in the second surface 17 of the semiconductor substrate 60h in a state where the semiconductor substrate 60h is fixed on the stage 85.

After the ion implantation, the resist 220 is removed and the ions implanted into the concave part 18 are thermally diffused by heating and annealing the semiconductor substrate 60h so that a second diffusion layer is formed from the surface of the concave part 18. In this regard, in the removal of the resist 220 and the anneal, because the semiconductor substrate 60h is placed on a stage while the first surface 16, which is a flat surface, is brought into contact with the surface of the stage, the process can be carried out always in a stable state.

As mentioned above, the diffusion layers are sequentially formed in the concave part 18, which is the semiconductor device formable area, from the side of the second surface 17 by repeating the process from the resist applying process of FIG. 16F to the second diffusion layer forming process of FIG. 16J. Then, all of the diffusion layers necessary for the semiconductor device such as a MOS transistor, an IGBT, etc., are formed.

Figure 16K:
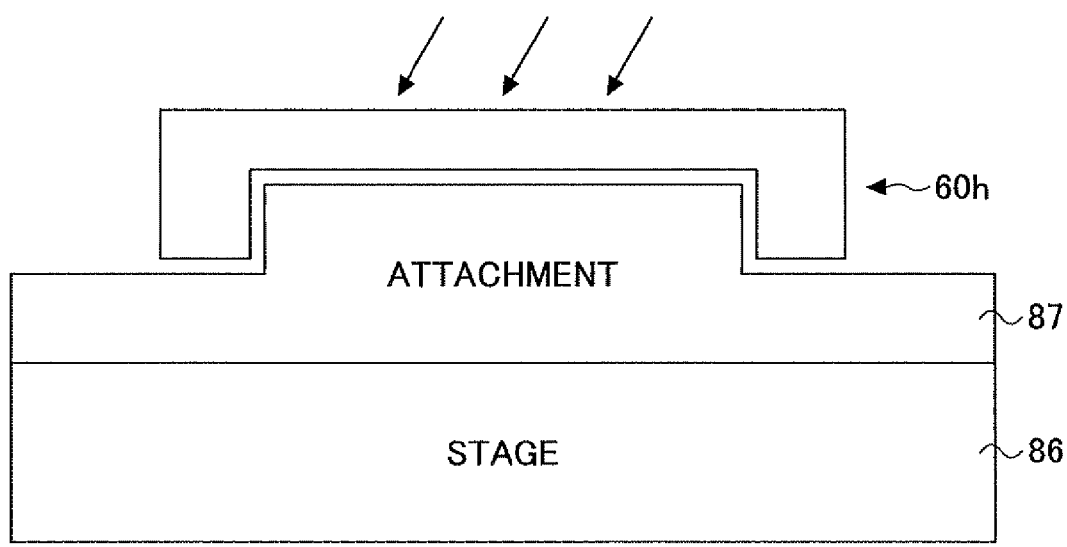
FIG. 16K is an illustration illustrating an example of a back surface metal forming process of the semiconductor device manufacturing method according to the embodiment 9.

FIG. 16K is an illustration illustrating an example of a back surface metal forming process of the manufacturing method of the semiconductor device according to the embodiment 9. In the back surface metal forming process, a metal film is formed on the first surface (back surface) of the semiconductor substrate 60h. In this case, the semiconductor substrate 60h is placed on a stage 86 of a sputtering apparatus while the second surface 17, which is the opposite surface of the first surface 16, is brought into contact with the surface of the stage 86, and because the second surface 17 is formed in the concave shape, the semiconductor substrate 60h cannot be stably supported on the surface of the stage 86 of the sputtering apparatus. Accordingly, an attachment 87 of a convex shape is inserted between the semiconductor substrate 60h and the stage 86 so that the semiconductor substrate 60h is stably supported on the stage 86. It is desirable to set the height of the convex part of the attachment 87 from the periphery to be coincident with a depth of the semiconductor substrate 60h or slightly higher than that. By using the attachment 87 of the concave shape, the semiconductor substrate 60h can be stably supported on the stage 86, and the sputtering can be carried out. Thereby, a thin film of metal can be formed on the first surface 16 of the semiconductor substrate 60h.

It should be noted that the back surface metal forming process is not always necessary, and may be provided if it is needed. As explained in the first diffusion layer forming process, because the formation of the diffusion layer to the first surface 16 is performed first, it is possible to form the diffusion layer on the first surface 16 with a sufficiently high concentration. Accordingly, a sufficient conductivity can be obtained with only the diffusion layer, and there may be a case where it is not always necessary to form a metal for conduction on the first surface 16.

Thus, according to the manufacturing method of the semiconductor device according to the present embodiment, by forming the diffusion layer on the back surface of the semiconductor substrate 15 first, it renders unnecessary the formation of the back surface metal.

Additionally, in the processes other than the back surface metal forming process, because the contact surface with the stage can be processed as the first surface 16, which is a flat surface, the process in each process can be performed easily and surely.

Although descriptions of the preferred embodiments have been given above, the present invention is not limited to the above-mentioned embodiments, and various variations can be made and replacements can be added without departing from the scope of the present invention.

INDUSTRIAL APPLICABILITY

The present invention is applicable to a semiconductor substrate for forming a semiconductor device such as a power MOS transistor and IGBT and a manufacturing method thereof and a semiconductor device and a manufacturing method thereof.

The present international application claims the priority of Japanese Patent Application No. 2009-134617 filed on Jun. 4, 2009, and the entire contents of Japanese Patent Application No. 2009-134617 are incorporated in this international application by reference.

The invention claimed is:
1. A semiconductor substrate, comprising:
a semiconductor device formable area, the semiconductor device formable area having a surface made of a semiconductor material used as a semiconductor layer that constitutes a part of the semiconductor device, wherein a reinforcing part, which is thicker than said semiconductor device formable area and has a top part of which surface is flat, is formed on an outer circumference part of the semiconductor substrate, and an inner side surface connecting said top part of the reinforcing part and said semiconductor device formable area has a cross-sec- tional shape of which inner diameter becomes smaller in proportion to its closeness to said semiconductor device formable area.

2. The semiconductor device as claimed in claim 1, wherein said inner side surface has a cross-sectional shape lineally connecting said top part and said semiconductor device formable area.

3. The semiconductor substrate as claimed in claim 1, wherein said inner side surface has a cross-sectional shape of which inclination angle becomes smaller in proportion to its closeness to said semiconductor device formable area.

4. The semiconductor substrate as claimed in claim 1, wherein said reinforcing part is formed by a semiconductor and has a cross-sectional structure of a sandwich structure having an oxidation film in a portion of the same thickness as said semiconductor device formable area.

5. The semiconductor substrate as claimed in claim 1, wherein said semiconductor device formable area and said reinforcing part are integrally formed by a semiconductor.

6. The semiconductor substrate as claimed in claim 1, wherein said semiconductor device formable area has a thickness equal to or smaller than 300 µm, and said reinforcing part has a thickness equal to or larger than 500 µm.

7. A semiconductor device formed in a semiconductor device formable area of a semiconductor substrate, comprising:
wherein a reinforcing part, which is thicker than said semiconductor device formable area and has a top part of which surface is flat, is formed on an outer circumference part of one surface of said semiconductor substrate, and diffusion layers made of a semiconductor material are formed on both surfaces of said semiconductor device formable area.

8. The semiconductor device as claimed in claim 7, wherein an electrode is formed on a surface of said semiconductor substrate where said reinforcing part is not formed.

9. The semiconductor device as claimed in claim 7, wherein said diffusion layer of the surface on which said reinforcing part of said semiconductor substrate is formed is a source or an emitter, and said diffusion layer of a surface on which said reinforcing part is not formed is a drain or a collector.

10. The semiconductor device as claimed in claim 7, wherein an inner side surface connecting said top part of said reinforcing part and said semiconductor device formable area has a cross-sectional shape of which inner diameter becomes smaller as being closer to said semiconductor device formable area.

* * * * *